US012666556B2

(12) United States Patent
Tsorng et al.

(10) Patent No.: US 12,666,556 B2
(45) Date of Patent: Jun. 23, 2026

(54) SLED WITH PUSH-PULL MECHANISM AND SERVER INCLUDING THE SAME

(71) Applicant: Quanta Computer Inc., Taoyuan City (TW)

(72) Inventors: Yaw-Tzorng Tsorng, Taoyuan City (TW); Tung-Hsien Wu, Taoyuan City (TW); Chia-Hung Kao, Taoyuan City (TW); Jun-Zhe Weng, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 126 days.

(21) Appl. No.: 18/743,731

(22) Filed: Jun. 14, 2024

(65) Prior Publication Data

US 2025/0386448 A1     Dec. 18, 2025

(51) Int. Cl.
*H05K 7/14* (2006.01)

(52) U.S. Cl.
CPC ......... *H05K 7/1461* (2013.01); *H05K 7/1488* (2013.01)

(58) Field of Classification Search
CPC .................................................. H05K 7/1461
See application file for complete search history.

(56) References Cited

U.S. PATENT DOCUMENTS

| | | | |
|---|---|---|---|
| 5,721,669 A | 2/1998 | Becker et al. | |
| 7,837,482 B2 * | 11/2010 | Kinoshita | H01R 43/26 |
| | | | 439/297 |
| 9,030,827 B2 * | 5/2015 | Jau | H05K 7/1487 |
| | | | 211/49.1 |
| 10,827,641 B1 * | 11/2020 | Shen | H05K 7/20709 |
| 2015/0062801 A1 * | 3/2015 | Zhang | A47B 46/00 |
| | | | 211/26.2 |
| 2020/0100381 A1 * | 3/2020 | Liu | F16H 7/02 |
| 2022/0377926 A1 * | 11/2022 | Wang | H05K 7/1489 |
| 2025/0147554 A1 * | 5/2025 | Liu | G06F 1/1624 |
| 2025/0247991 A1 * | 7/2025 | Xu | H05K 7/1487 |

FOREIGN PATENT DOCUMENTS

| | | |
|---|---|---|
| CN | 210178121 U | 3/2020 |
| CN | 219698237 U | 9/2023 |
| TW | 201408158 A | 2/2014 |

OTHER PUBLICATIONS

TW Office Action for Application No. 113134638 mailed Jul. 21, 2025, w/ Summary, 16 pp.
TW Search Report for Application No. 113134638 mailed Jul. 21, 2025, w/ First Office Action, 1 p.

* cited by examiner

*Primary Examiner* — Sagar Shrestha
*Assistant Examiner* — Peter Krim
(74) *Attorney, Agent, or Firm* — NIXON PEABODY LLP

(57)                 ABSTRACT

A sled for a server device is disclosed. The sled includes a sled housing and a push-pull mechanism. The sled housing has a first side wall that is parallel to a second side wall, and a space is formed between the first side wall and the second side wall. The push-pull mechanism includes a first mechanism coupled to the first side wall and a second mechanism coupled to the second side wall. The push-pull mechanism is configured to facilitate pushing the sled into and pulling the sled from a chassis of the server device. The pushing results in a lead-in lock position, and the pulling results in a lead-out lock position. Also disclosed is a server device having a chassis in which the sled is configured to be pushed into and pulled from the chassis.

22 Claims, 35 Drawing Sheets

A

908

B

912

910

C

604

310

206

1000

D

908

906

SLED WITH PUSH-PULL MECHANISM AND SERVER INCLUDING THE SAME

FIELD OF THE INVENTION

The present invention relates generally to a sled for a server device with a push-pull mechanism that does not require a separate tool for pushing the sled into and pulling the sled from a chassis of the server device, and more specifically, to a push-pull mechanism including compound gears and two racks.

BACKGROUND OF THE INVENTION

In general, a lever ejector is used to push a sled into and pull the sled from a chassis. However, the lever may take up a lot of space at a rear side of the sled, thereby affecting installation of components, such as network interface controller (NIC) cards. For example, a number of the components that can be installed in the sled may be affected due to the reduced space caused by the lever located at the rear side of the sled.

Therefore, a need exists for an improved mechanism that allows for pushing and pulling a sled without taking up too much space in the sled. The present disclosure is directed to a tool-less push-pull mechanism used for a sled, thereby providing an easy solution for saving space within the sled by placing the mechanism on the side of the sled. The push-pull mechanism also allows for easier pushing/pulling of the sled by using a gear mechanism.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a sled for a server device is disclosed. According to various embodiments, the sled includes a sled housing and a push-pull mechanism. The sled housing has a first side wall that is parallel to a second side wall, and a space is formed between the first side wall and the second side wall. The push-pull mechanism includes a first mechanism coupled to the first side wall and a second mechanism coupled to the second side wall. The push-pull mechanism is configured to facilitate pushing the sled to and pulling the sled from a chassis of the server device, the pushing resulting in a lead-in lock position and the pulling resulting in a lead-out lock position. Each of the first and second mechanisms includes a compound gear train, a short rack and a long rack. The compound gear train has at least three compound gears that are rotatable to result in a respective one of the lead-in lock position and the lead-out lock position. The short rack is configured to mesh with one of the at least three compound gears, the short rack guiding movement of the sled between the lead-in lock position and the lead-out lock position. The long rack is configured to mesh with a different one of the at least three compound gears, the long rack guiding movement of the sled between the lead-in lock position and the lead-out lock position.

In some examples, the short rack is fixed to a rail that is coupled to the chassis. The short rack is fixed in both the lead-in lock position and the lead-out lock position.

In some examples, each of the first and second mechanisms further includes at least three shafts. The at least three shafts pass through bores of respective ones of the at least three compound gears. The at least three shafts are coupled to one of the first or second side walls.

In some examples, each of the first and second mechanisms further includes a cover bracket configured to cover in part the at least three compound gears. The at least three shafts pass through respective through-holes formed on the cover bracket.

In some examples, the at least three shafts include screws configured to lock the at least three compound gears to the first side wall or the second side wall. The at least three compound gears are mounted on a respective one of the at least three shafts. The at least three compound gears rotate in response to the pushing or pulling of the sled.

In some examples, the at least three compound gears include a first compound gear, a second compound gear, and a third compound gear. The first compound gear has a first large gear and a first small gear. The second compound gear has a second large gear and a second small gear. The third compound gear has a third large gear and a third small gear. In some examples, the first, second, and third compound gears are the same size.

In some examples, the first small gear is configured to mesh with the short rack, and the third large gear is configured to mesh with the long rack.

In some examples, the first large gear meshes with the second small gear. The second large gear meshes with the third small gear. The first, second, and third compound gears are spaced apart without interfering with each other.

In some examples, each of the first, second, and third large gears has a number of large gear teeth that is twice a number of small gear teeth of each of the first, second, and third small gears. In some examples, when the at least three compound gears rotate, a speed of the second compound gear is half of a speed of the third compound gear, and a speed of the first compound gear is a quarter of the speed of the third compound gear. In some examples, when the third compound gear rotates counterclockwise, the second compound gear rotates clockwise, and the first compound gear rotates counterclockwise.

In some examples, each of the first and second mechanisms further includes a bracket on which the long rack is fixed. The bracket is configured to slide under the at least three compound gears.

In some examples, the bracket is coupled to a handle mechanism via a fastener. The handle mechanism includes a handle.

In some examples, the fastener includes a captive screw attached to the handle mechanism and fastened to a receiving hole formed on the bracket.

In some examples, the handle mechanism further includes a first latch configured to fix the sled and the chassis in the lead-in lock position. In some examples, the handle is configured to unlock, and is released from the sled housing and the chassis, in response to pressing a first latch button in the lead-in lock position. When unlocked, the handle is pullable out of the sled housing and chassis into the lead-out lock position.

In some examples, the sled further includes a stopper located on a floor of the sled. The stopper is configured to contact the bracket in response to pulling the handle. The handle is prevented from being pulled further when the short rack and the first small gear disengage.

In some examples, the handle mechanism further includes a second latch configured to pop up when the bracket contacts the stopper, in response to the pulling the handle out. The popped-up second latch prevents the pulled handle from being pushed into the sled housing.

In some examples, the handle is allowed to be pushed back into the sled housing. The first latch is configured to fix the handle in response to pressing the second latch button after the sled is pulled out of the chassis.

In some examples, both the first latch and the second latch are popped up in response to pushing the handle into the lead-in lock position. The first latch prevents the handle from being pulled out of the sled housing and chassis. The second latch prevents the handle that is in the lead-in lock position from being pushed in further.

In some examples, when the handle is pushed inward, such that the sled is pushed into the chassis, the second latch contacts a rear wall of the chassis. At this point, the sled can no longer be pushed inward unless a second latch button is pressed. In some examples, the sled can be pushed into the chassis in response to pushing the handle inward, following pressing of the second latch button.

In some examples, the first small gear contacts the short rack when the sled is pushed into the chassis.

According to certain aspects of the present disclosure, a server device is disclosed. According to various embodiments, the server device includes a chassis and a sled configured to be pushed into and pulled out of the chassis. The sled includes a sled housing and a push-pull mechanism. The sled housing has a first side wall that is parallel to a second side wall. A space is formed between the first side wall and the second side wall. The push-pull mechanism includes a first mechanism coupled to the first side wall and a second mechanism coupled to the second side wall. The push-pull mechanism is configured to facilitate pushing the sled into and pulling the sled from the chassis. The pushing results in a lead-in lock position and the pulling results in a lead-out lock position. Each of the first and second mechanisms includes a compound gear train, a short rack, and a long rack. The compound gear train has at least three compound gears that are rotatable to result in a respective one of the lead-in lock position and the lead-out lock position. The short rack is configured to mesh with one of the at least three compound gears, the short rack guiding movement of the sled between the lead-in lock position and the lead-out lock position. The long rack is configured to mesh with a different one of the at least three compound gears, the long rack guiding movement of the sled between the lead-in lock position and the lead-out lock position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
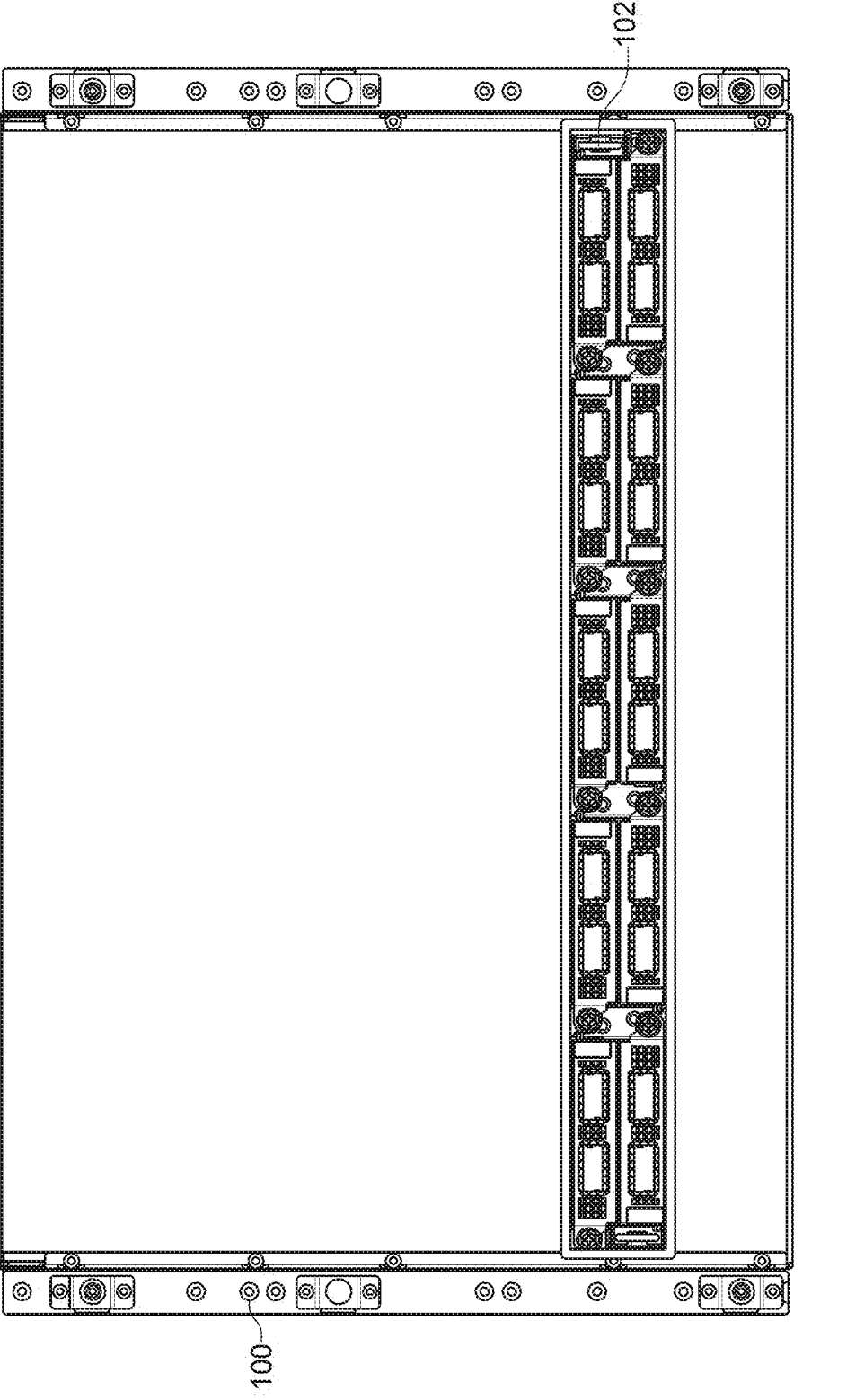
FIG. 1A is a rear view of a chassis including a sled, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a telecommunication system such as servers. A chassis of a server receives a sled or sleds including various components. A sled of the present disclosure has a push-pull mechanism that allows easy pushing and pulling of the sled with respect to the chassis. The push-pull mechanism includes compound gears and two different racks interacting with the compound gears such that no tools are required to push in or pull out the sled.

Figure 1B:
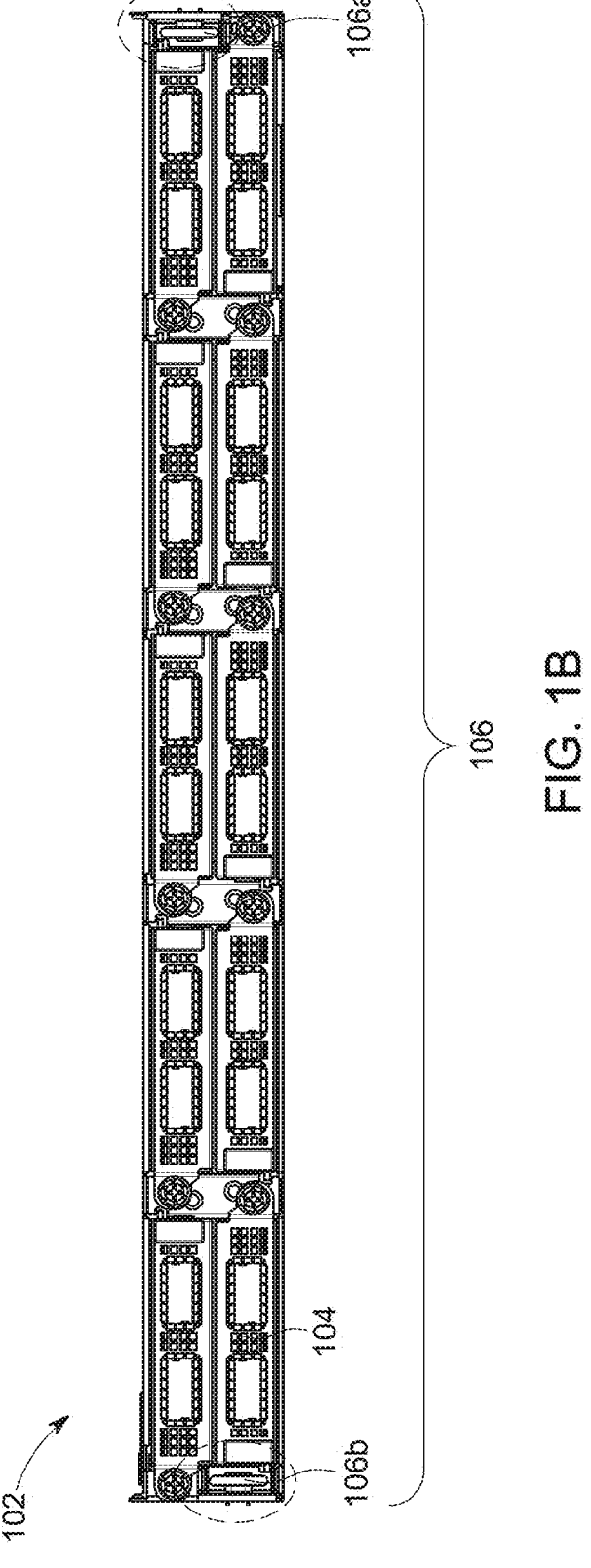
FIG. 1B is a rear view of the sled shown in FIG. 1A, according to certain aspects of the present disclosure.

Referring to FIG. 1A, shown is a rear view of a chassis 100 of a telecommunication system or server, according to an aspect of the present disclosure. In particular, rear walls of the chassis 100 are shown, one on the left side and the other on the right side, in FIG. 1A. The chassis 100 is configured to receive one or more sled 102. FIG. 1B shows the sled 102 including a plurality of network interface controller (NIC) cards 104, according to an aspect of the present disclosure. Referring to FIG. 1B, the sled 102 has a push-pull mechanism 106 coupled to its side walls. The push-pull mechanism 106 includes a first mechanism 106a and a second mechanism 106b.

Figure 2A:
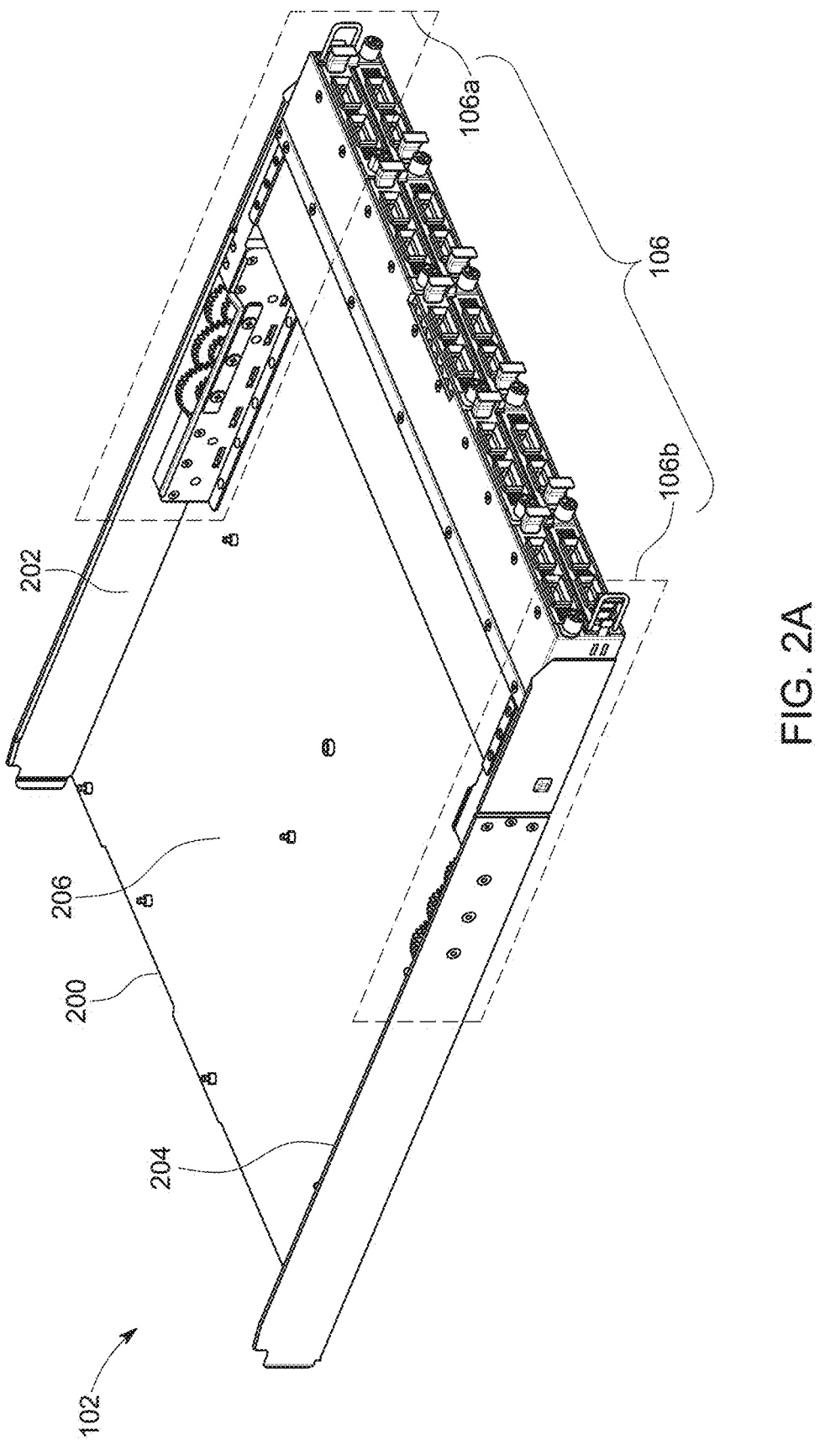
FIG. 2A is a perspective view of a sled, according to certain aspects of the present disclosure.
Figure 2B:
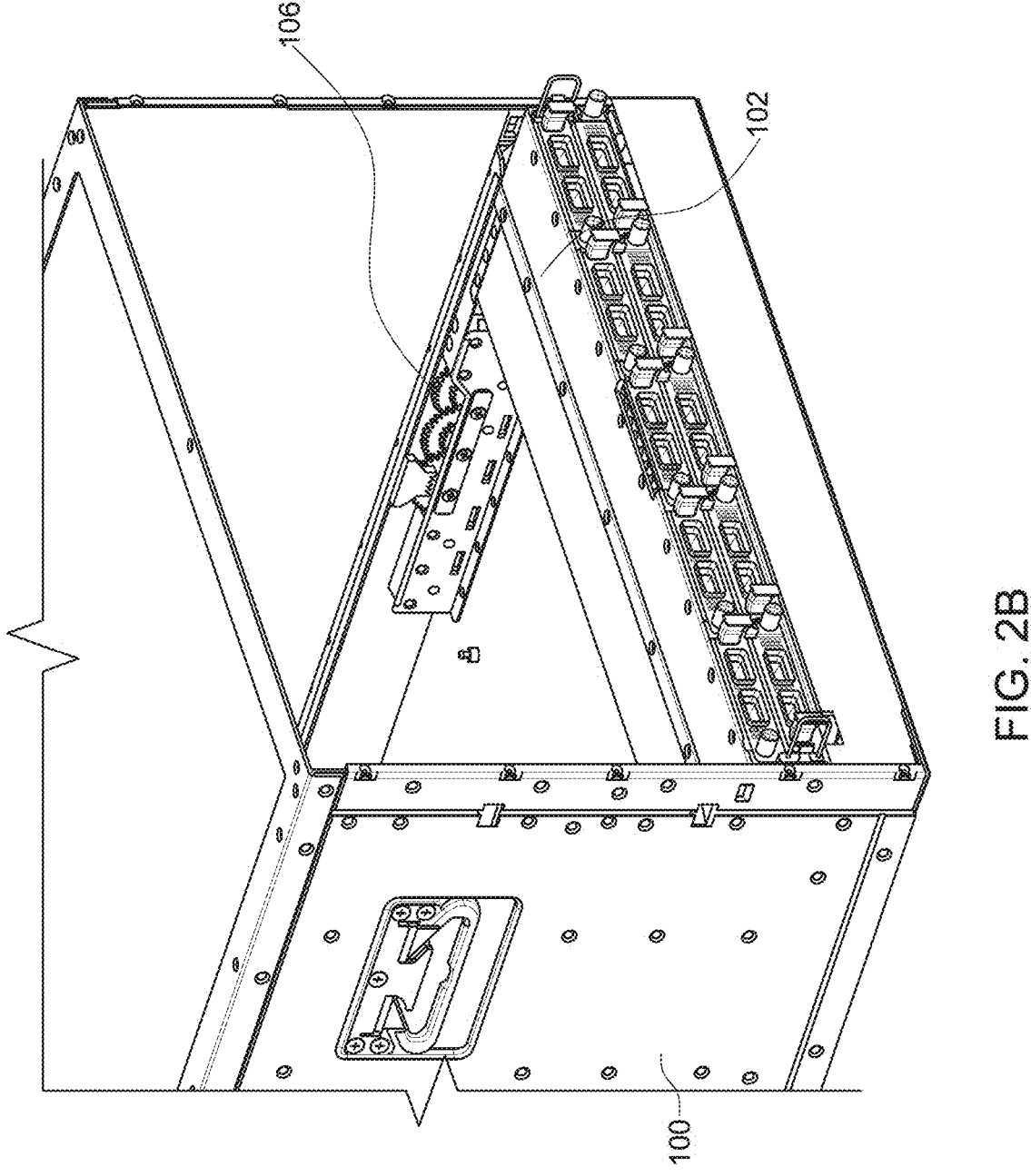
FIG. 2B is a partial perspective view of a chassis with the sled shown in FIG. 2A received therein, according to certain aspects of the present disclosure.

Referring to FIGS. 2A and 2B, shown are perspective views of a sled 102 and a chassis 100 including the sled 102, respectively, according to an aspect of the present disclosure. The sled 102 has the push-pull mechanism 106. The push-pull mechanism 106 is configured to facilitate pushing the sled 102 to and pulling the sled 102 from the chassis 100 of the server device. Pushing the sled 102 results in a lead-in lock position and pulling the sled 102 results in a lead-out lock position, The sled 102 includes a sled housing 200 having a first side wall 202 that is parallel to a second side wall 204. A space is formed between the first side wall 202 and the second side wall 204. A floor 206 of the sled housing 200 bridges the first side wall 202 and the second side wall 204. The push-pull mechanism 106 includes a first mechanism 106a coupled to the first side wall 202 and a second mechanism 106b coupled to the second side wall 204. As shown in FIG. 2B, the sled 102 having the push-pull mechanism 106 is received in the chassis 100.

Figure 3A:
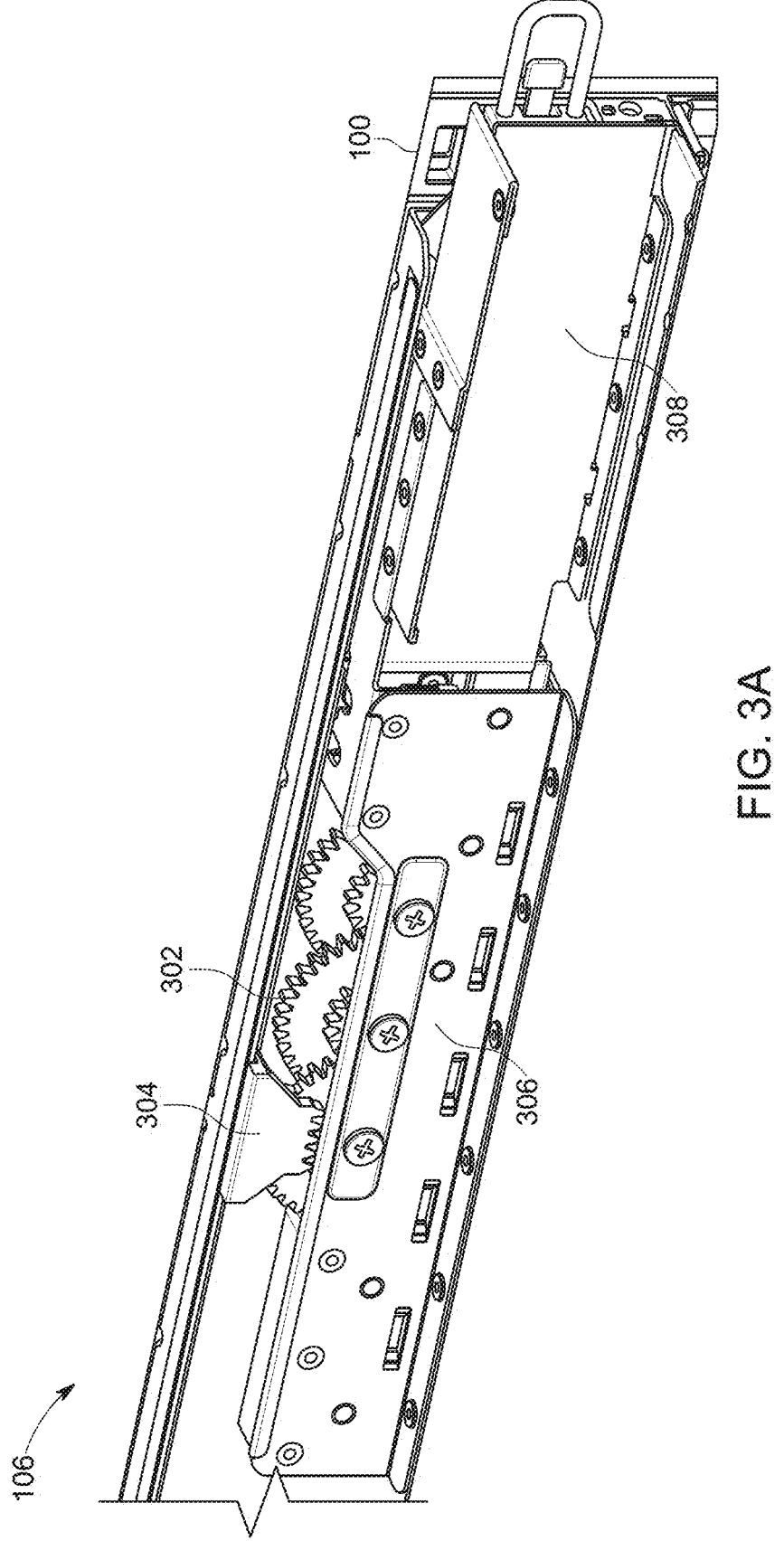
FIG. 3A is a perspective view of a push-pull mechanism, according to certain aspects of the present disclosure.
Figure 3B:
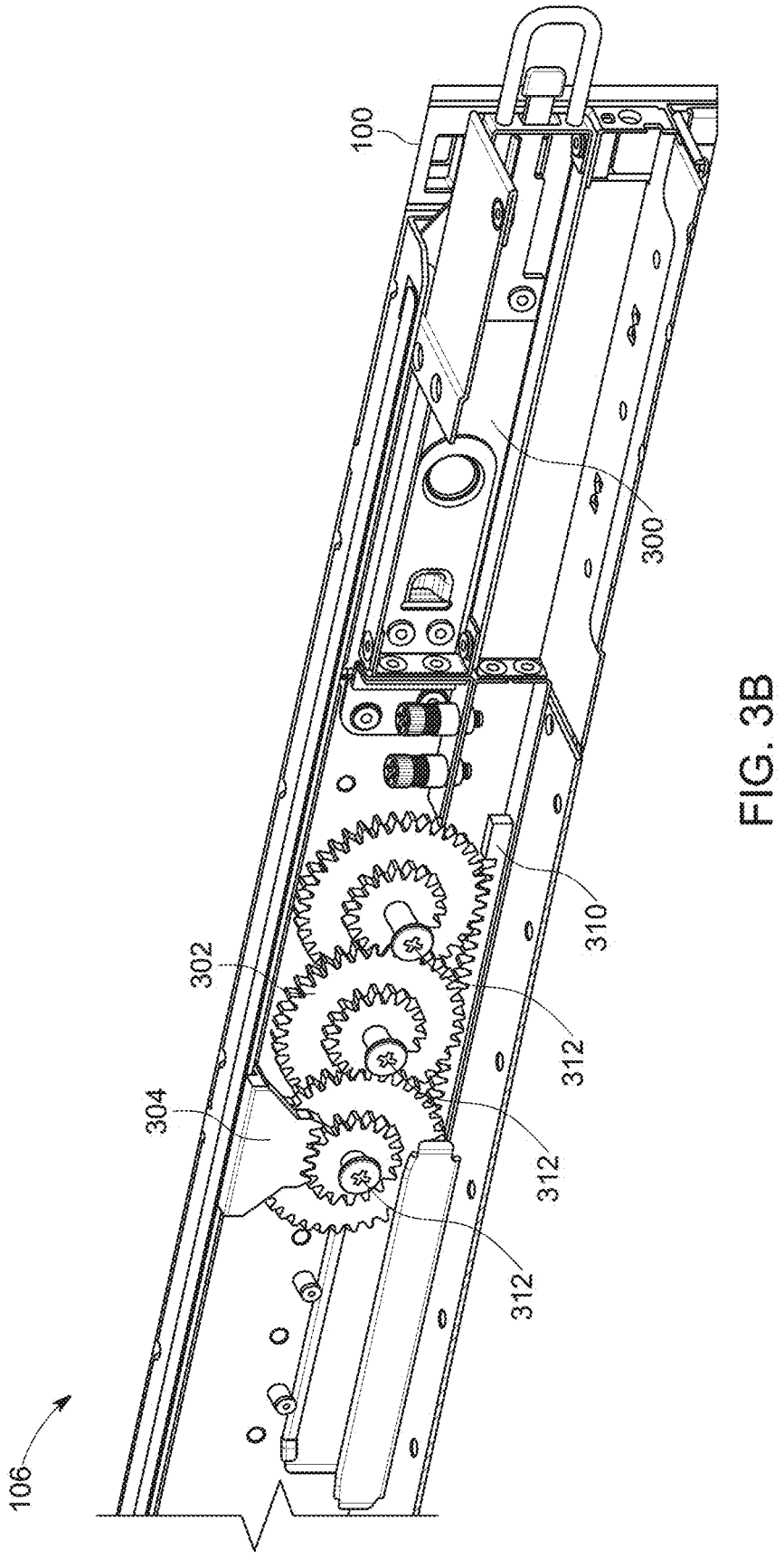
FIG. 3B is a perspective view of the push-pull mechanism shown in FIG. 3A without bracket covers, according to certain aspects of the present disclosure.

FIGS. 3A and 3B show a push-pull mechanism 106 with a handle mechanism 300, according to an aspect of the present disclosure. In these drawings, only one of the first and second mechanisms 106a, 106b (indicated as 106) is shown. In FIGS. 3A and 3B, the push-pull mechanism 106 is within the chassis 100. The push-pull mechanism 106 includes a compound gear train 302 and a short rack 304. In FIG. 3B, cover brackets 306, 308 are removed from the push-pull mechanism 106. The push-pull mechanism further includes a long rack 310. Each compound gear of the compound gear train 302 is on a corresponding shaft 312.

Figure 4:
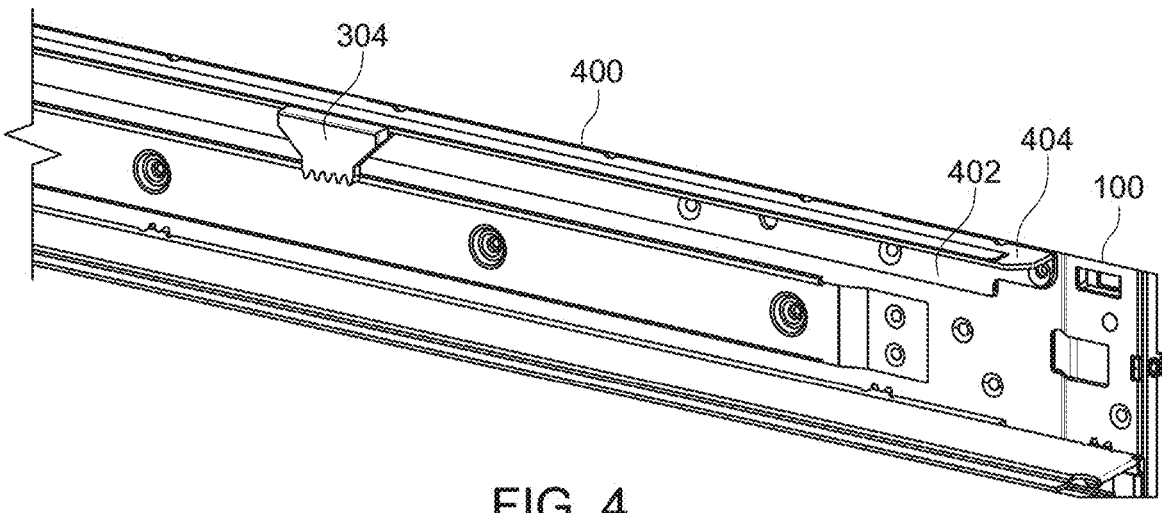
FIG. 4 is a perspective view of a short rack attached to a rail, according to certain aspects of the present disclosure.

Referring to FIG. 4, the short rack 304 is coupled to a rail 400 that is attached to the chassis 100. According to some embodiments, the rail 400 has two walls 402, 404 that are perpendicular. For example, the first wall 402 is attached to the chassis 100, and the short rack 304 is coupled to the second wall 404. In some embodiments, the short rack 304 is fixed underneath the second wall 404. Thus, the position of the short rack 304 is fixed contrary to the position of the long rack 310 that is variable according to the movement of the push-pull mechanism 106. That is, the short rack 304 is fixed in both the lead-in lock position and the lead-out lock position.

Figure 5A:
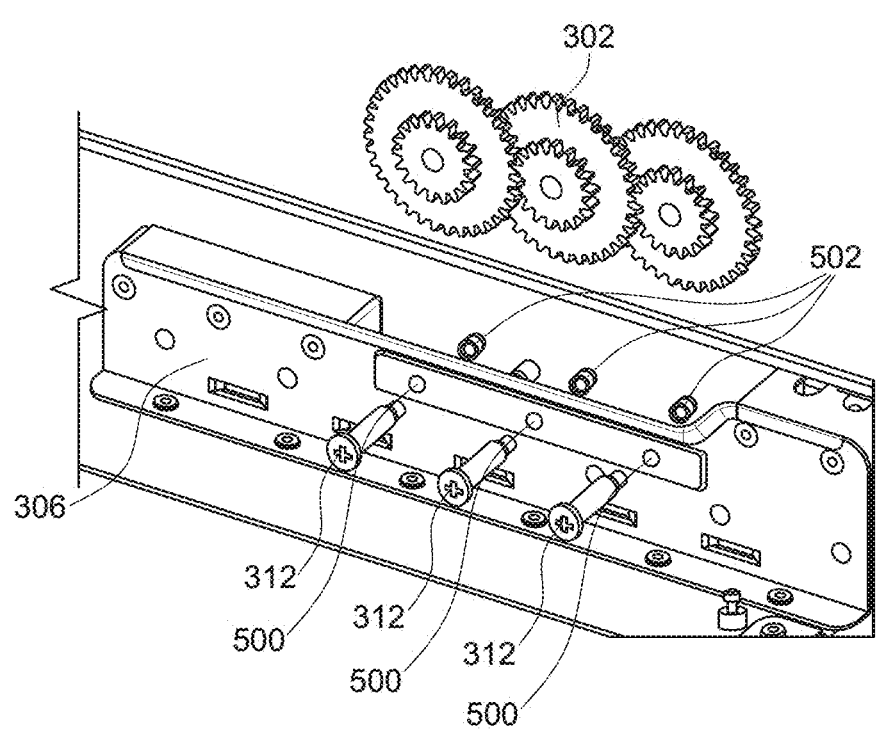
FIG. 5A shows how compound gears are assembled for a push-pull mechanism, according to certain aspects of the present disclosure.
Figure 5B:
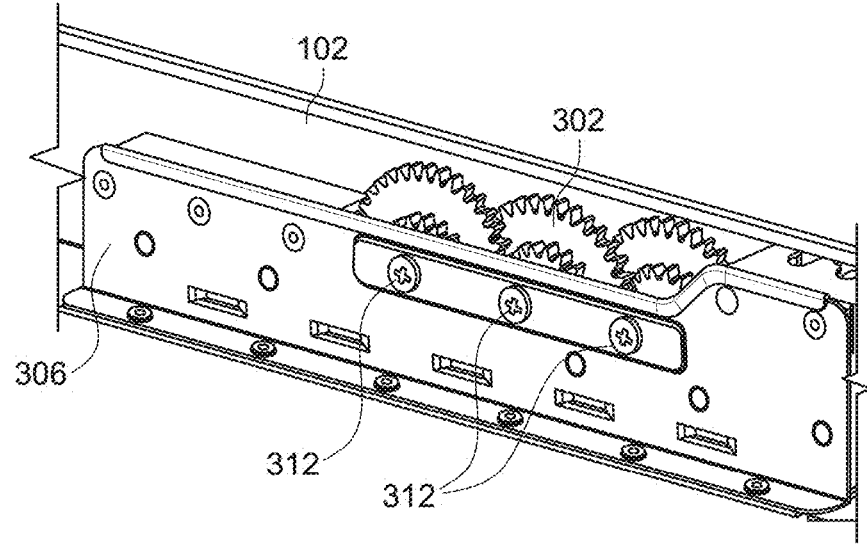
FIG. 5B is a perspective view of an assembled push-pull mechanism including the compound gears shown in FIG. 5A, according to certain aspects of the present disclosure.

FIGS. 5A and 5B show a compound gear train 302 of a push-pull mechanism 106, according to an aspect of the present disclosure. To assemble the compound gear train 302, first, the compound gears are inserted into a space between a wall of the sled 102 and the cover bracket 306.

The shafts 312 pass through holes 500 of the cover bracket 306 and centers/bores of the compound gears of the compound gear train 302. The shafts 312 are fixed to shaft receiving portions 502 formed on the sled 102. In some embodiments, the shafts 312 are screw-type fasteners. In some embodiments, the shaft receiving portions 502 protrude from the wall of the sled 102. As exemplified in FIGS. 5A and 5B, in some embodiments, the three shafts 312 include screws configured to lock the three compound gears to the first side wall 202 or the second side wall 204 of the sled 102. The three compound gears of the compound gear train 302 are mounted on a respective one of the three shafts 312 such that the three compound gears rotate in response to the pushing or pulling of the sled 102.

Figure 6A:
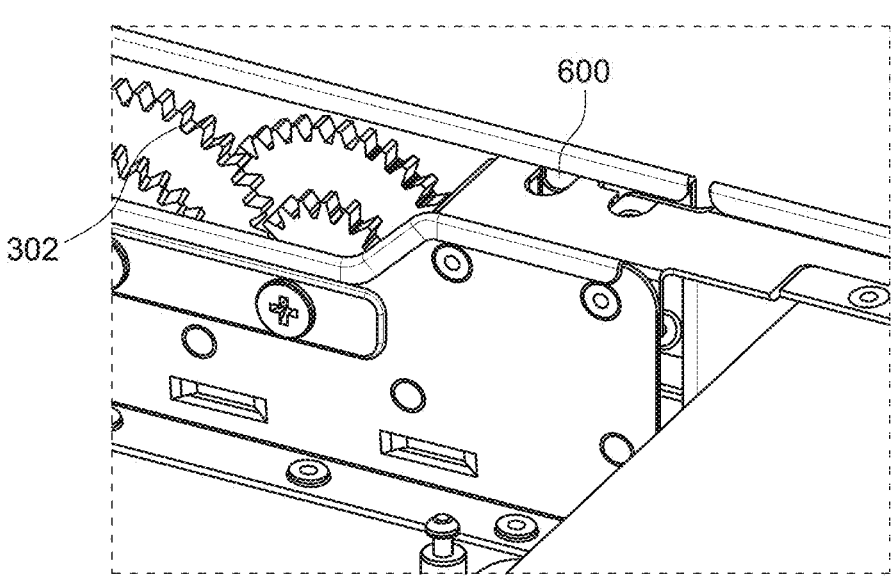
FIG. 6A is a perspective view of a portion of a push-pull mechanism including captive screw receiving holes, according to certain aspects of the present disclosure.
Figure 6B:
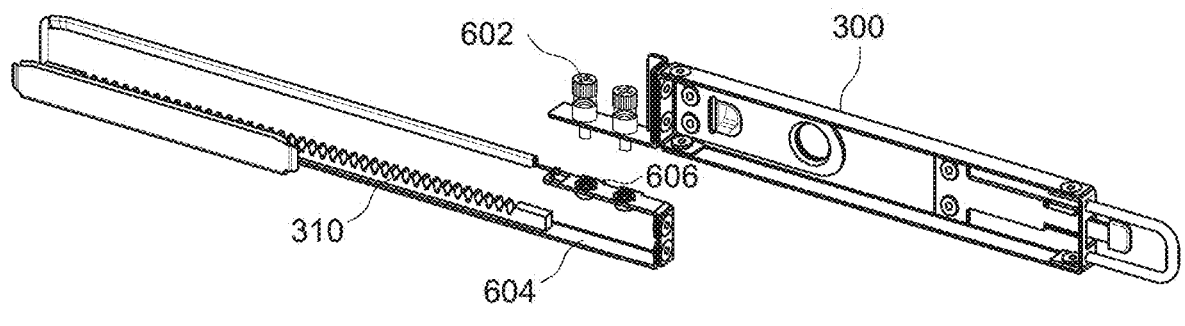
FIG. 6B is a perspective view of a bracket and a handle mechanism, according to certain aspects of the present disclosure.
Figure 6C:
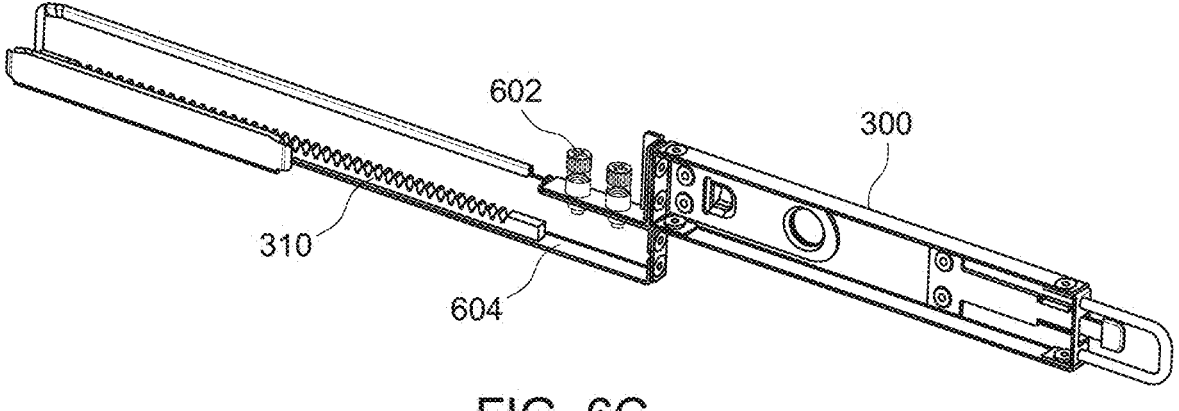
FIG. 6C is a perspective view of the bracket and handle mechanism shown in FIG. 6B that are coupled, according to certain aspects of the present disclosure.

FIG. 6A shows a perspective view of a portion of a push-pull mechanism 106 with holes 600 for receiving captive screws 602, according to an aspect of the present disclosure. As shown in FIG. 6B, the captive screws 602 are received within the holes 600 of the handle mechanism 300. According to an aspect of the present disclosure, the long rack 310 is fixed on a bracket 604. Therefore, the bracket 604 with the long rack 310 can slide under the compound gear train 302. The long rack 310 meshes with the compound gear train 302 when the bracket 604 with the long rack 310 slides. As shown in FIG. 6C, the captive screws 602 are inserted into receiving portions 606 formed on the bracket 604 such that the handle mechanism 300 is coupled to the bracket 604.

Figure 7A:
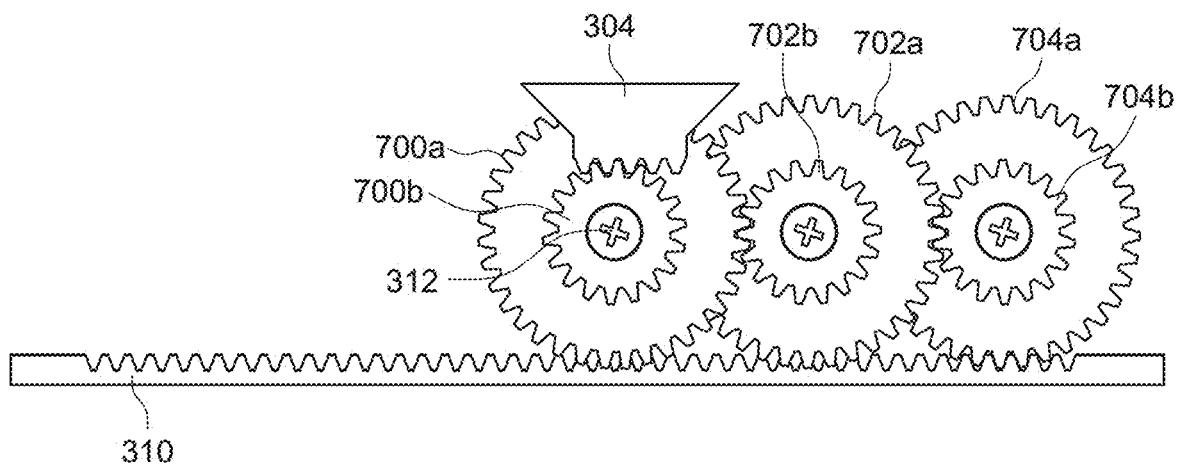
FIG. 7A is a side view of compound gears, a short rack, and a long rack, according to certain aspects of the present disclosure.
Figure 7B:
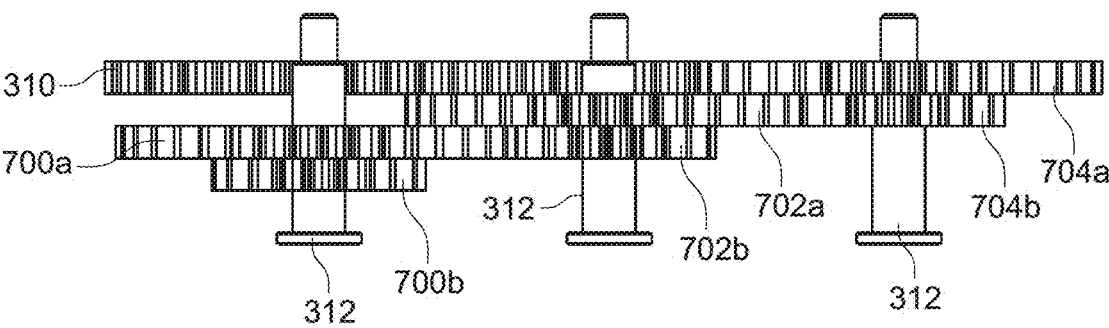
FIG. 7B is a top view of the compound gears and the long rack shown in FIG. 7A, according to certain aspects of the present disclosure.
Figure 7C:
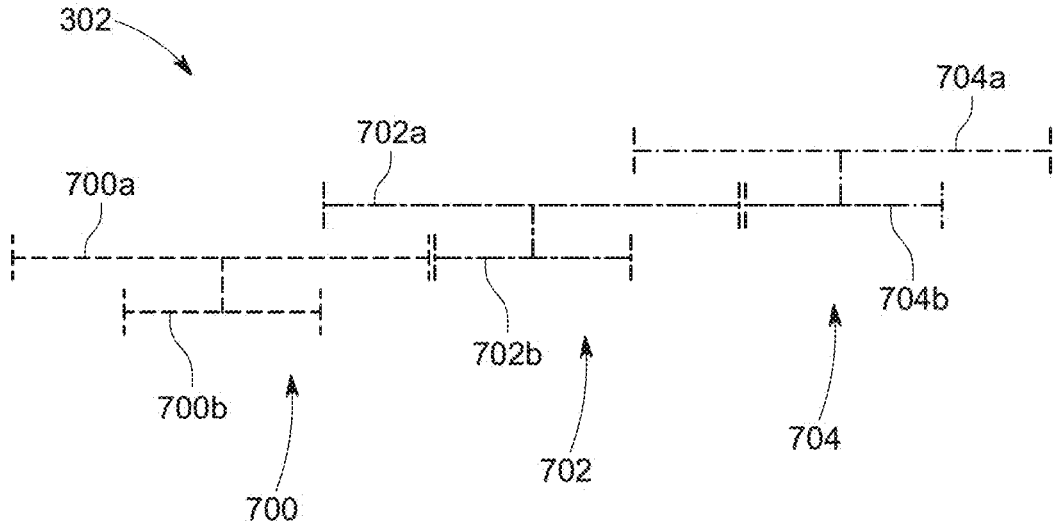
FIG. 7C is a schematic diagram of the compound gears shown in FIG. 7B, according to certain aspects of the present disclosure.

FIGS. 7A-7C show a side view, a top view, and a schematic diagram, respectively, of a compound gear train 302, according to an aspect of the present disclosure. The compound gear train 302 includes a plurality of compound gears. The compound gears are rotatable to result in a respective one of the lead-in lock position and the lead-out lock position. In some embodiments, the number of the compound gears is an odd number, for example, 3, 5, or 7. Although the number of compound gears shown in the drawings is three, the number is not limited thereto. For example, the compound gear train 302 includes three gears, a first compound gear 700, a second compound gear 702, and a third compound gear 704. The first compound gear 700 includes a first large gear 700a and a first small gear 700b. The second compound gear 702 includes a second large gear 702a and a second small gear 702b. The third compound gear 704 includes a third large gear 704a and a third small gear 704b.

The three compound gears 700, 702, and 704 are the same size. The first large gear 700a meshes with the second small gear 702b. The second large gear 702a meshes with the third small gear 704b. The three compound gears 700, 702, and 704 are arranged to not interfere with each other. There are two types of racks, the long rack 310 and the short rack 304. The long rack 310 meshes with the third large gear 704a. The short rack 304 meshes with the first small gear 700b. The short rack 304 guides movement of the sled 102 between the lead-in lock position and the lead-out lock position. The long rack 310 also guides movement of the sled 102 between the lead-in lock position and the lead-out lock position.

In some embodiments, each of the first, second, and third large gears 700a, 702a, 704a has a number of large gear teeth that is twice a number of small gear teeth of each of the first, second, and third small gears 700b, 702b, 704b. When the three compound gears 700, 702, 704 rotate, a speed of the second compound gear 702 is a half of a speed of the third compound gear 704, and a speed of the first compound gear 700 is a quarter of the speed of the third compound gear 704. When the third compound gear 704 rotates counterclockwise, the second compound gear 702 rotates clockwise and the first compound gear 700 rotates counterclockwise. The gear mechanism of the push-pull mechanism is described further, referring to FIGS. 8A and 8B.

Figure 8A:
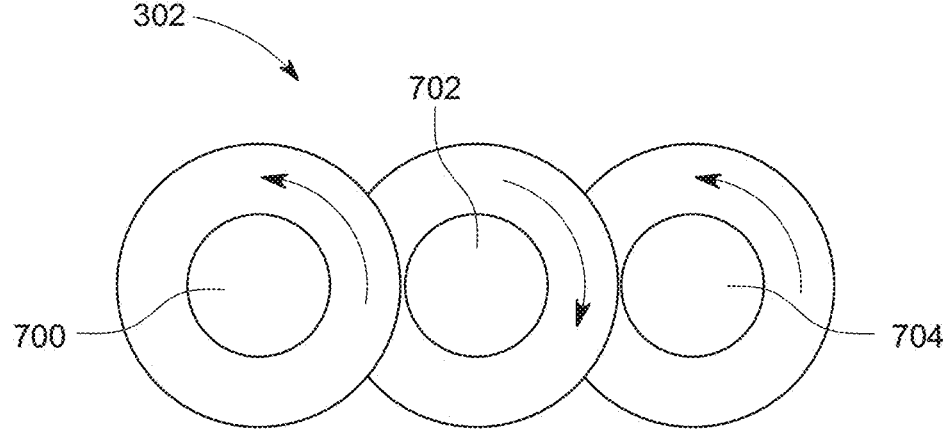
FIG. 8A is a schematic diagram of a compound gear train, according to certain aspects of the present disclosure.
Figure 8B:
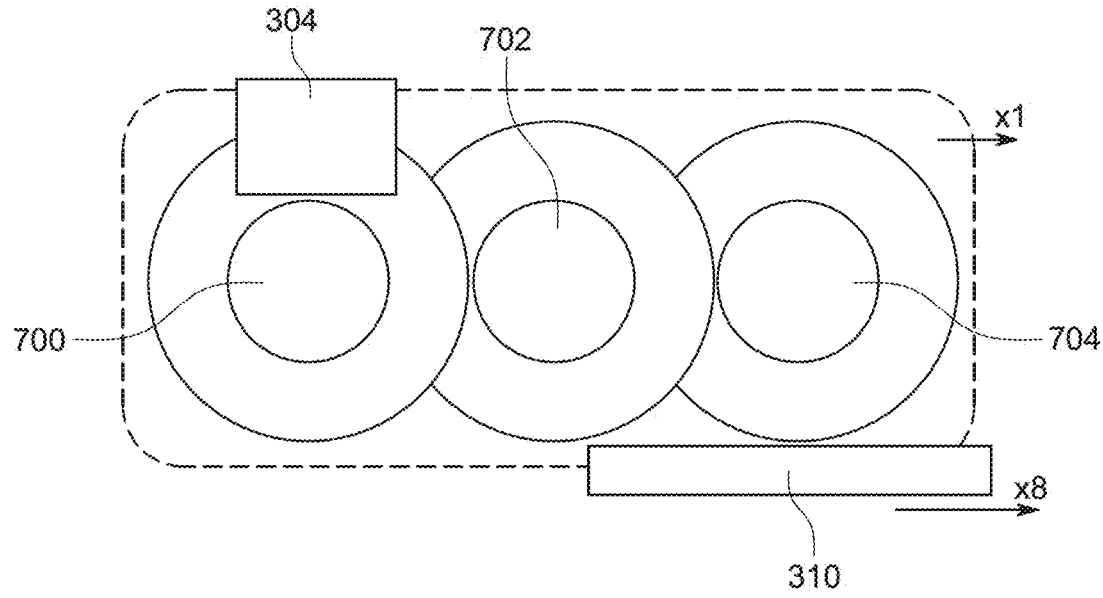
FIG. 8B is a schematic diagram of a gear mechanism of compound gears, according to certain aspects of the present disclosure.

FIGS. 8A and 8B show schematic diagrams of the compound gear train 302, according to an aspect of the present disclosure. In order to achieve the saving-effort effect of the push-pull mechanism 106, the small gears 700*b*, 702*b*, 704*b* are used as driving gears and the large gears 700*a*, 702*a*, 704*a* are used as driven gears. For example, a number of large gear teeth of each of the large gears 700*a*, 702*a*, 704*a* is twice the number of small gear teeth of each of the small gears 700*b*, 702*b*, 704*b*. When the third compound gear 704 is used as the driving gear, the speed of the second compound gear 702 is a half of the speed of the third compound gear 704. The speed of the first compound gear 700 is a quarter of the speed of the third compound gear 704. When the third compound gear 704 rotates counterclockwise, the second compound gear 702 rotates clockwise, and the first compound gear 700 rotates counterclockwise.

After the short rack 304, long rack 310, and compound gears 700, 702, 704 are assembled, the moving direction and distance of the racks 304, 310 are affected by the compound gears 700, 702, 704. The long rack 310 is used to drive the third large gear 704*a*, and the first small gear 700*b* is used to drive the short rack 304. In this exemplary embodiment, the position of the short rack 304 is fixed by being attached to the chassis 100. The long rack 310 and the compound gear train 302 move in the same direction. For example, in the drawings, as the long rack 310 moves to the right, the compound gear train 302 also moves to the right. When the compound gear train 302 moves a distance that is twice the distance the short rack 304 moves, the long rack 310 moves a distance that is eight times the distance the compound gear train 302 moves.

FIGS. 9A-9D show various views of a handle mechanism 300 shown in FIG. 3B and including a first latch 900 and a second latch 902, according to an aspect of the present disclosure. In FIGS. 9A-9D, the sled 102 shown in FIGS. 1A and 1B is in the lead-in lock position. The first latch 900 is used to fix the handle mechanism 300, sled 102, and chassis 100 shown in FIG. 1A. The first latch button 910 is pressed to unlock a handle 904. Once unlocked, the handle 904 can be pulled out of the sled 102 and the chassis 100. When the unlocked handle 904 is pulled out into the lead-out lock position, a second latch lock 908 pops up and is fixed on the sled 102. Thus, the pulled-out state of the handle 904 can be maintained. To push the handle 904 back into the sled 102, the second latch button 906 is pressed, and then the handle 904 is pushed inwards. When the handle 904 is pushed into the lead-in lock position, a first latch lock 912 pops up and is fixed on the sled 102 and the chassis 100. Thus, the pushed-in state of the handle 904 can be maintained. When the handle 904 is pushed into the lead-in lock position, both the first latch lock 912 and the second latch lock 908 pop up. The first latch lock 912 prevents the handle 904 from being pulled out. The second latch lock 908 prevents the handle 904 from being pushed in.

Figure 10A:
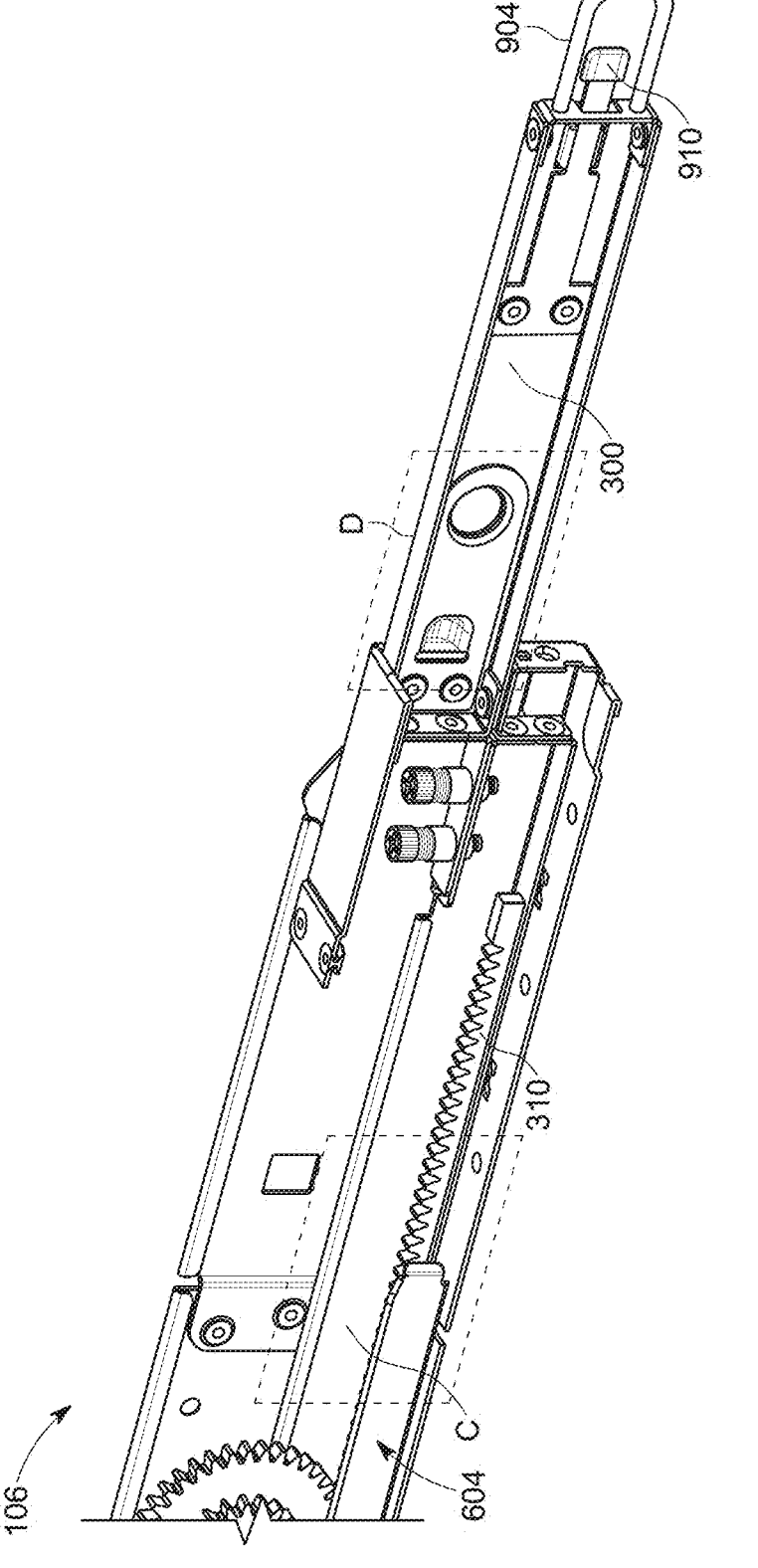
FIG. 10A is a perspective view of a push-pull mechanism with a handle mechanism, according to certain aspects of the present disclosure.
Figure 10B:
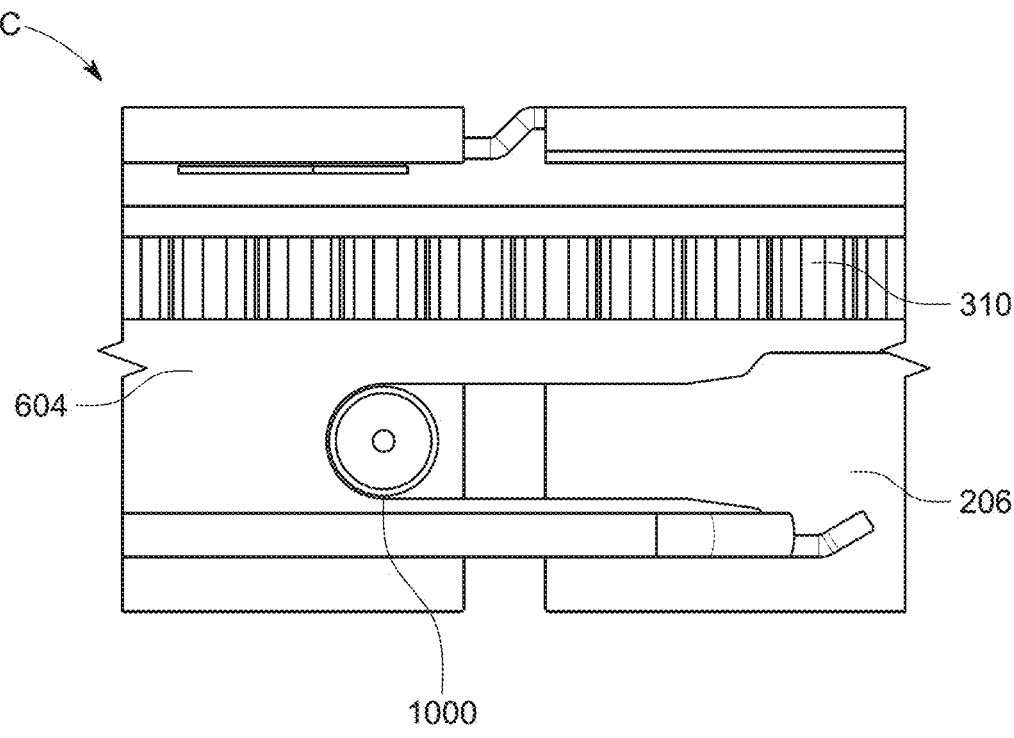
FIG. 10B is a top view of C shown in FIG. 10A, according to certain aspects of the present disclosure.
Figure 10C:
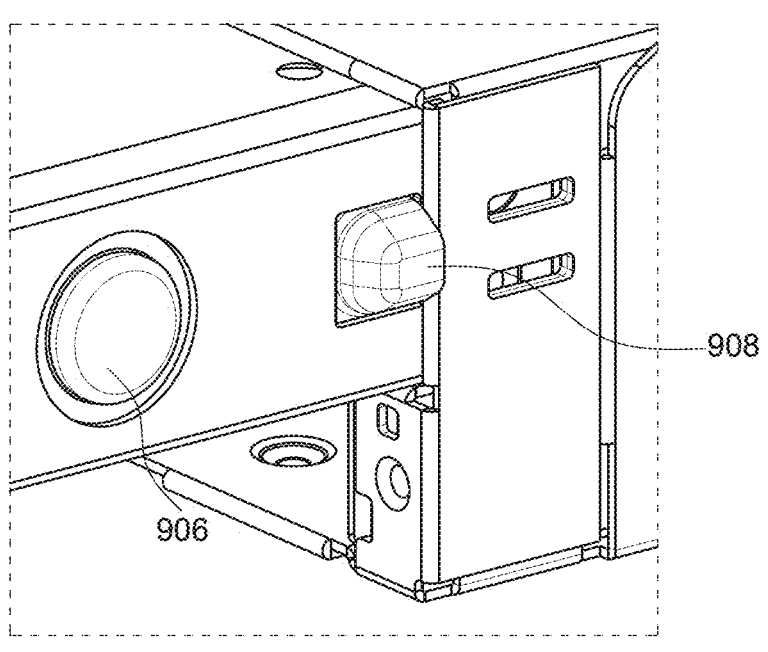
FIG. 10C is a perspective view of D shown in FIG. 10A viewed from an opposite direction, according to certain aspects of the present disclosure.

FIG. 10A shows a push-pull mechanism 106 with a handle mechanism 300 in the lead-out lock position, according to certain aspects of the present disclosure. FIGS. 10B and 10C show areas C and D, respectively, indicated in FIGS. 10A, according to certain aspects of the present disclosure. The bracket 604 with the long rack 310 is coupled to the handle mechanism 300. When the handle 904 is pulled out to the lead-out lock position, the second latch lock 908 pops up, as shown in FIG. 10C. Thus, the handle 904 is prevented from being pushed in. Further, there is a stopper 1000 on the floor 206 of the sled 102 shown in FIGS. 1A and 1B. In some embodiments, the stopper 1000 protrudes from the floor 206. When the handle 904 is pulled out to the lead-out lock position, as shown in FIG. 10A, the bracket 604 with the long rack 310 contacts the stopper 1000. Thus, the handle 904 is prevented from being pulled beyond the stopper 1000. For example, as shown in FIG. 10B, a side of the bracket 604 that faces the floor 206 of the sled housing 200 is shaped to match the shape of the stopper 1000. Thus, further movement of the bracket 604 is blocked by the stopper 1000.

Figures 11A, 11B:
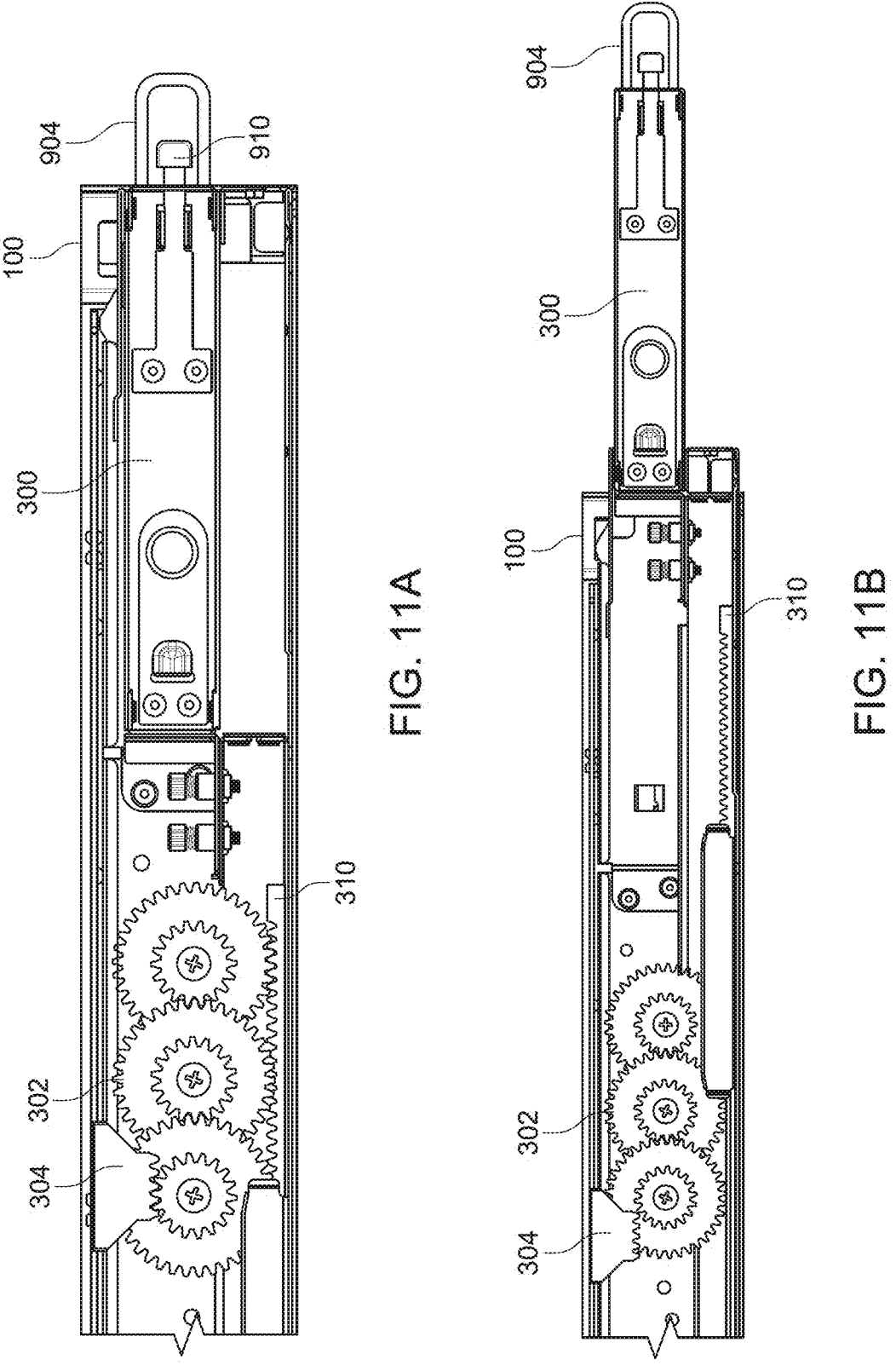
FIG. 11A is a side view of a push-pull mechanism with a handle mechanism at the start of a lead-out process, according to certain aspects of the present disclosure.
FIG. 11B is a side view of the push-pull mechanism with the handle mechanism shown in FIG. 11A at the end of the lead-out process, according to certain aspects of the present disclosure.

FIGS. 11A and 11B depict an exemplary movement of the sled 102 shown in FIGS. 1A and 1B, according to certain aspects of the present disclosure. The moving distance relationship between the handle 904 and the sled 102 in the tool-less push-pull mechanism 106 is determined based on the gear ratio of the gear mechanism. A lead-out starting point is depicted in FIG. 11A and a lead-out finishing point is depicted in FIG. 11B. The gear ratio can be calculated from the number of teeth of each gear. For example, each large gear 700*a*, 702*a*, 704*a* has twice as many teeth as the small gear 700*b*, 702*b*, 704*b*. For example, each large gear 700*a*, 702*a*, 704*a* has 36 teeth and each small gear 700*b*, 702*b*, 704*b* has 18 teeth. The gear ratio of the gear mechanism can be calculated to be 8. That is, according to the gear ratio, the distance the long rack 310 moves is 8 times that of the compound gear train 302. In FIG. 11A, both the sled location and the handle location are at 0 millimeter (mm). To make the sled 102 travel 14.1 mm, which is determined by connecter engagement, the handle 904 needs to be pulled outward by a distance of 112.8 mm such that the sled location is at 14.1 mm and the handle location is at 126.9 mm, as shown in FIG. 11B. Although specific numbers are described as exemplary locations referring to FIGS. 11A and 11B, the numbers are not limited thereto and the numbers may be different in some embodiments. Calculation of the gear ratio is as follows.

$$\text{gear ratio} = \frac{\text{teeth of driven gear}}{\text{teeth of driver gear}} = \frac{36 \times 36 \times 36}{18 \times 18 \times 18} = 8$$

Figure 12A:
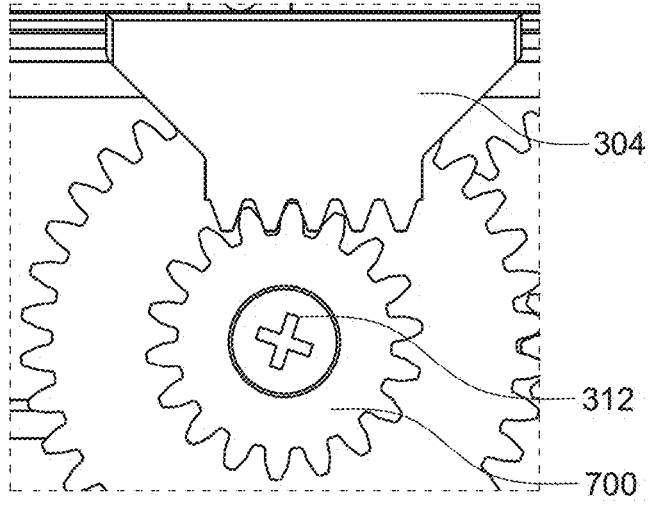
FIG. 12A is a side view of a short rack meshed with a first compound gear, according to certain aspects of the present disclosure.
Figure 12B:
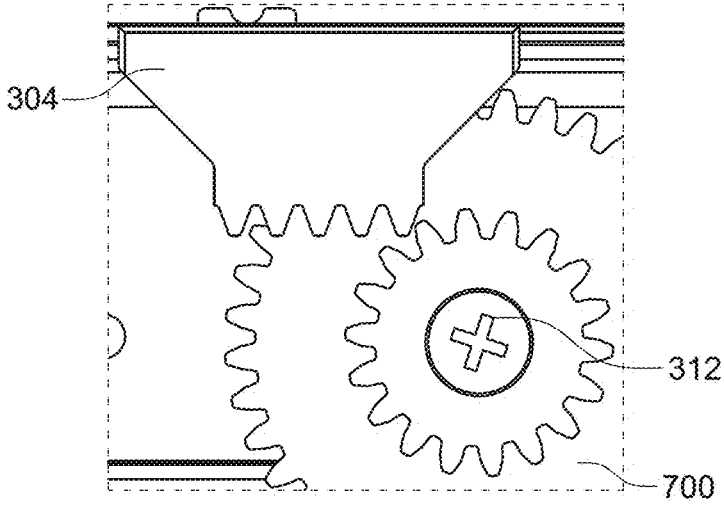
FIG. 12B is a side view of a short rack disengaged from a first compound gear, according to certain aspects of the present disclosure.

Referring to FIG. 12A, when the sled 102 is fixed in the chassis 100, the short rack 304 and the first compound gear 700 engage with each other. In a state shown in FIG. 11A, pressing the first latch button 910 can release the handle 904 from the sled 102 shown in FIGS. 1A and 1B and the chassis 100. When the handle 904 is pulled, the gear mechanism of the push-pull mechanism 106 starts to move. When the handle 904 is pulled to the lead-out lock position, as shown in FIG. 11B, the short rack 304 and first compound gear 700 disengage, as exemplified in FIG. 12B. At this point, the sled 102 can be pulled out directly. When the sled 102 is pushed into the chassis 100, the handle 904 should be in the lead-out lock position prior to starting to push the handle 904 into the chassis 100. When the second latch lock 908 contacts the rear wall of the chassis 100 and when the short rack 304 and the first compound gear 700 are in contact, the second latch button 906 can be pressed to push the handle 904 into the sled 102. Eventually, the short rack 304 and first compound gear 700 re-engage to be in the lead-in lock position.

Figure 9A:
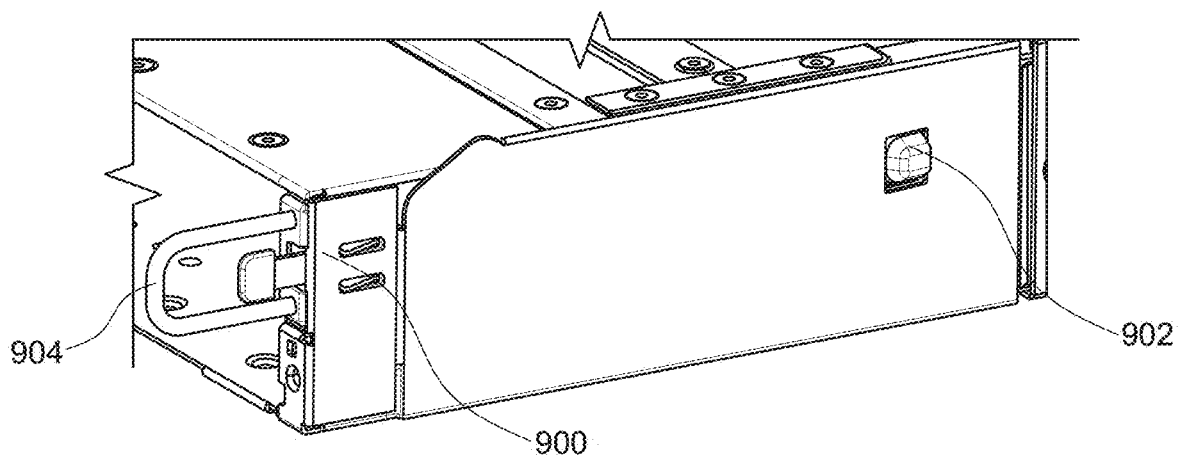
FIG. 9A is a perspective view of a portion of a sled at which latches are located, according to certain aspects of the present disclosure.
Figure 9B:
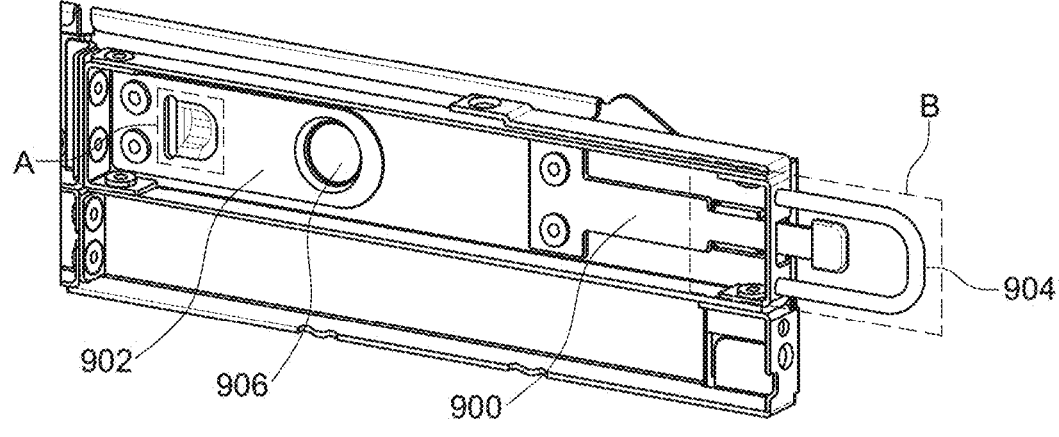
FIG. 9B is a perspective view of a handle mechanism including the latches shown in FIG. 9A, according to certain aspects of the present disclosure.
Figure 9C:
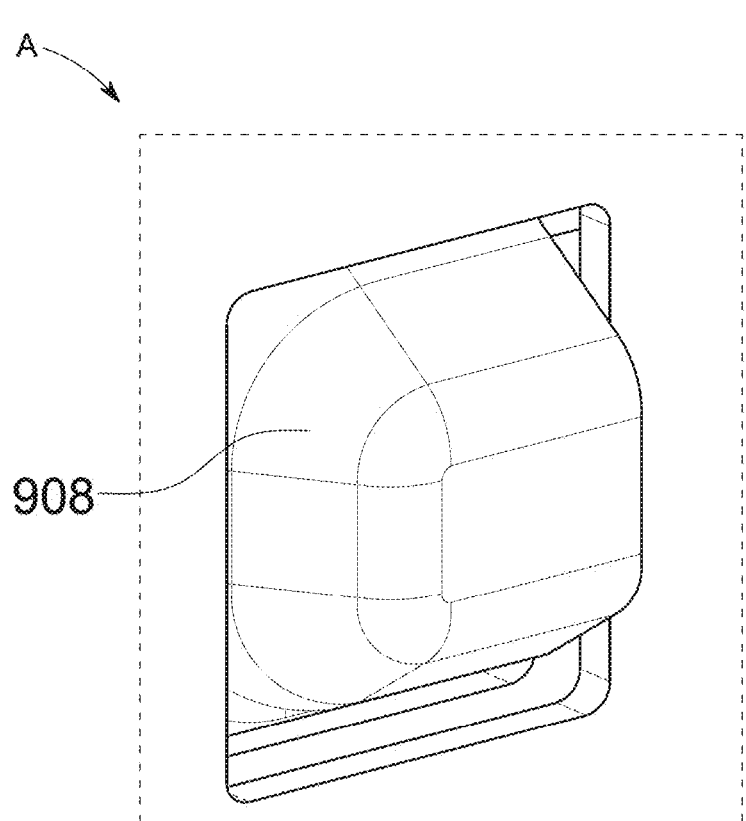
FIG. 9C is a magnified view of A shown in FIG. 9B viewed from an opposite direction, according to certain aspects of the present disclosure.
Figure 9D:
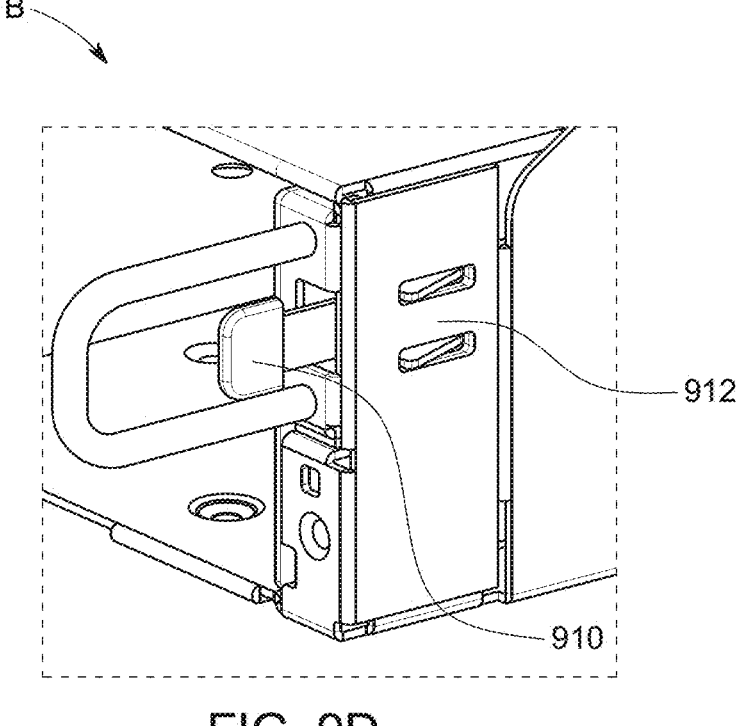
FIG. 9D is a magnified view of B shown in FIG. 9B viewed from an opposite direction, according to certain aspects of the present disclosure.
Figures 13A, 13B:
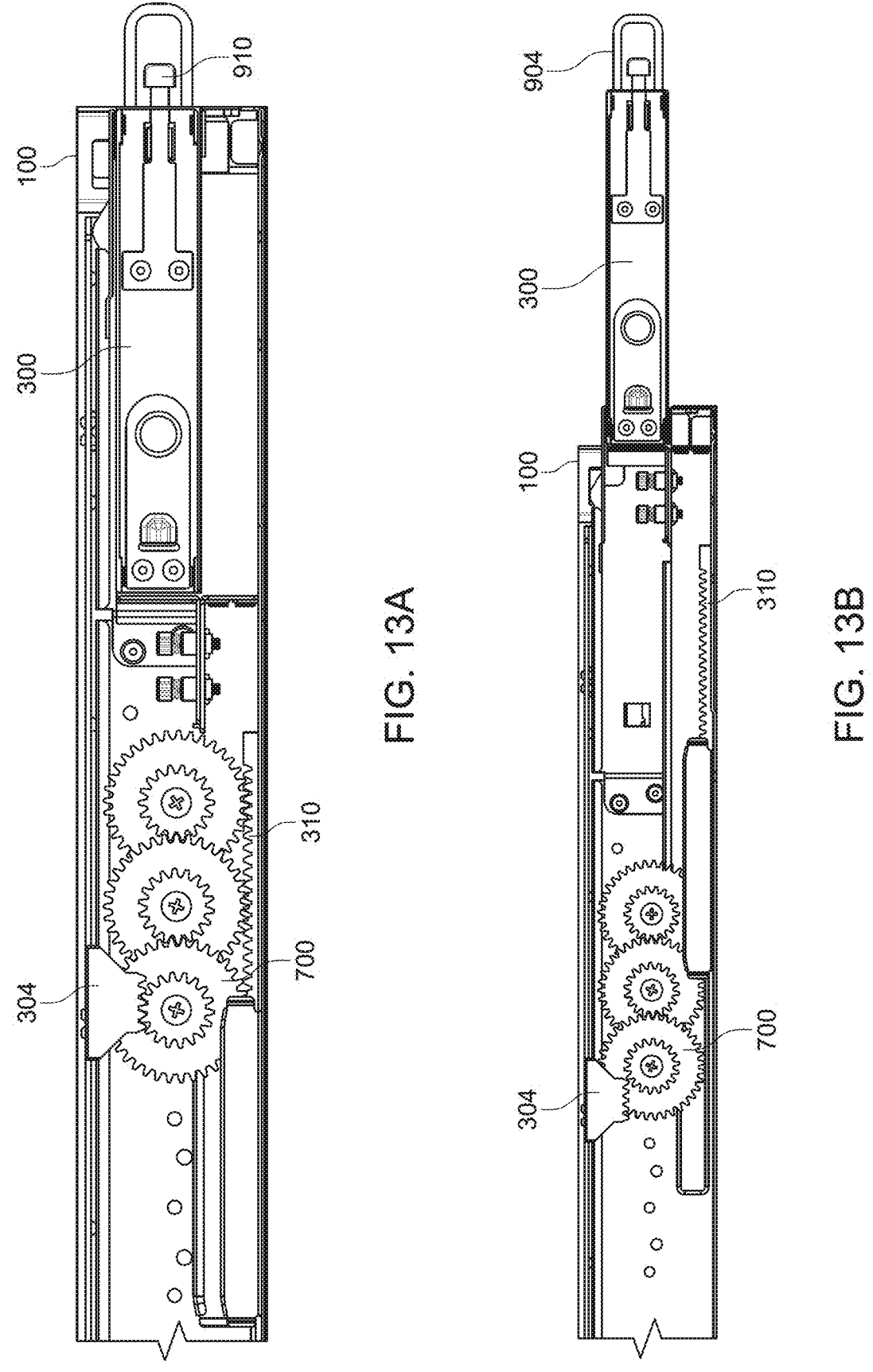
FIG. 13A is a side view a push-pull mechanism with a handle mechanism in a lead-out process, according to certain aspects of the present disclosure.
FIG. 13B is a side view of a push-pull mechanism with a handle mechanism further in the lead-out process, according to certain aspects of the present disclosure.
Figure 13C:
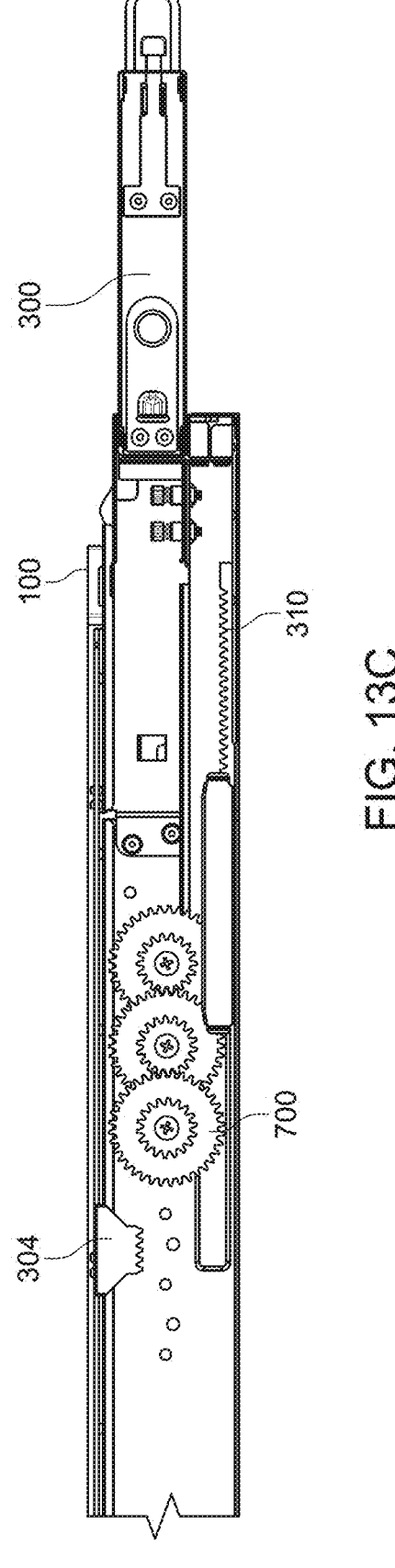
FIG. 13C is a side view of a push-pull mechanism with a handle mechanism further in the lead-out process, according to certain aspects of the present disclosure.

Referring to FIGS. 13A-13C, a lead-out process, according to certain aspects of the present disclosure, is described. In order to pull the sled 102 shown in FIGS. 1A and 1B that is in the lead-in lock position from the chassis 100, start with the handle 904 locked by the first latch lock 912 on the sled 102 and the chassis 100. Also see FIGS. 9B and 9D showing the handle 904 locked in the lead-in lock position. First, the first latch button 910 is pressed to release the handle 904 from the sled 102 and the chassis 100 (FIG. 13A). Second, the handle 904 is pulled out until the short rack 304 and the first compound gear 700 are disengaged (FIG. 13B). Lastly, the handle 904 is further pulled out to take out the sled 102 from the chassis 100. The sled 102 is now in the lead-out lock position in FIG. 13C.

Figures 14A, 14B:
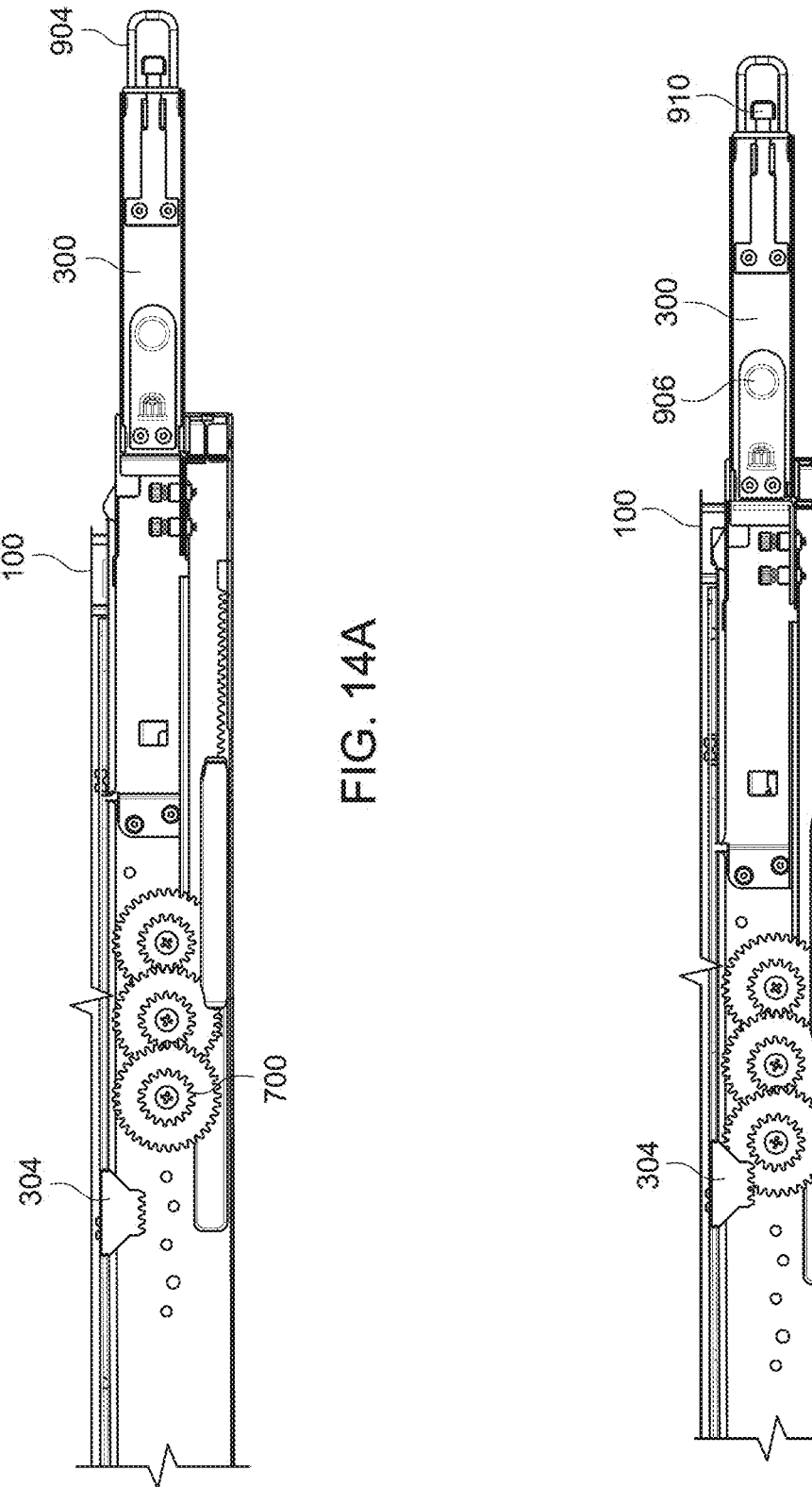
FIG. 14A is a side view a push-pull mechanism with a handle mechanism in a lead-in process, according to certain aspects of the present disclosure.
FIG. 14B is a side view of a push-pull mechanism with a handle mechanism further in the lead-in process, according to certain aspects of the present disclosure.
Figure 14C:
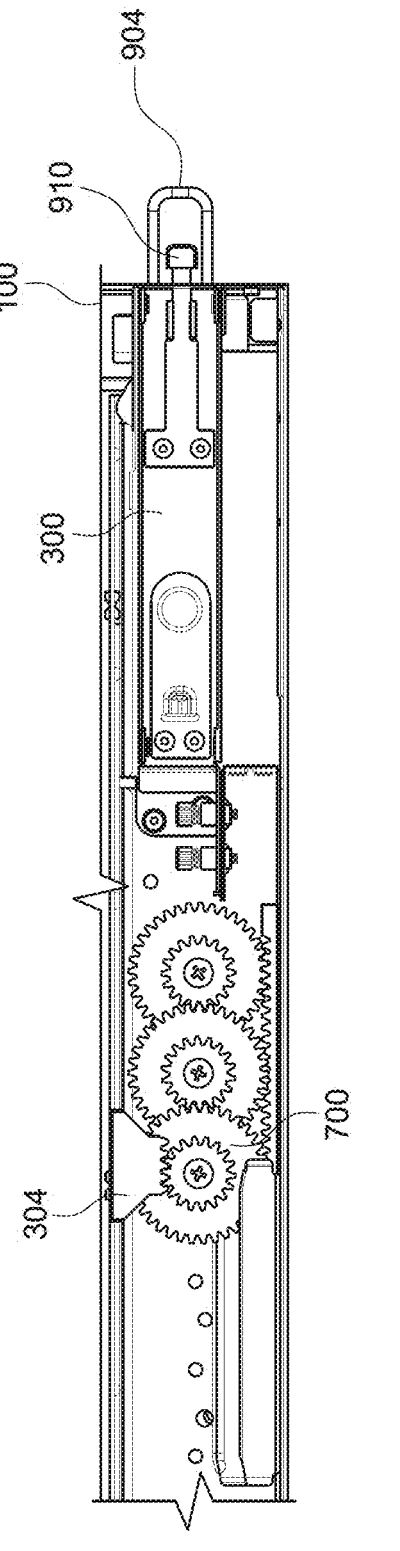
FIG. 14C is a side view of a push-pull mechanism with a handle mechanism further in the lead-in process, according to certain aspects of the present disclosure.

Referring to FIGS. 14A-14C, a lead-in process, according to certain aspects of the present disclosure, is described. In order to load the sled 102 shown in FIGS. 1A and 1B that is in the lead-out lock position into the chassis 100 (FIG. 14A), the handle 904 is pushed inward until the second latch lock 908 shown in FIG. 9C contacts the rear wall of chassis 100. When the first compound gear 700 contacts the short rack 304, the second latch button 906 is pressed and the handle 904 is pushed inward. The handle 904 is pushed further until the short rack 304 and the first compound gear 700 are fully engaged. The sled 102 is now in the lead-in lock position in FIG. 14C.

Figure 15A:
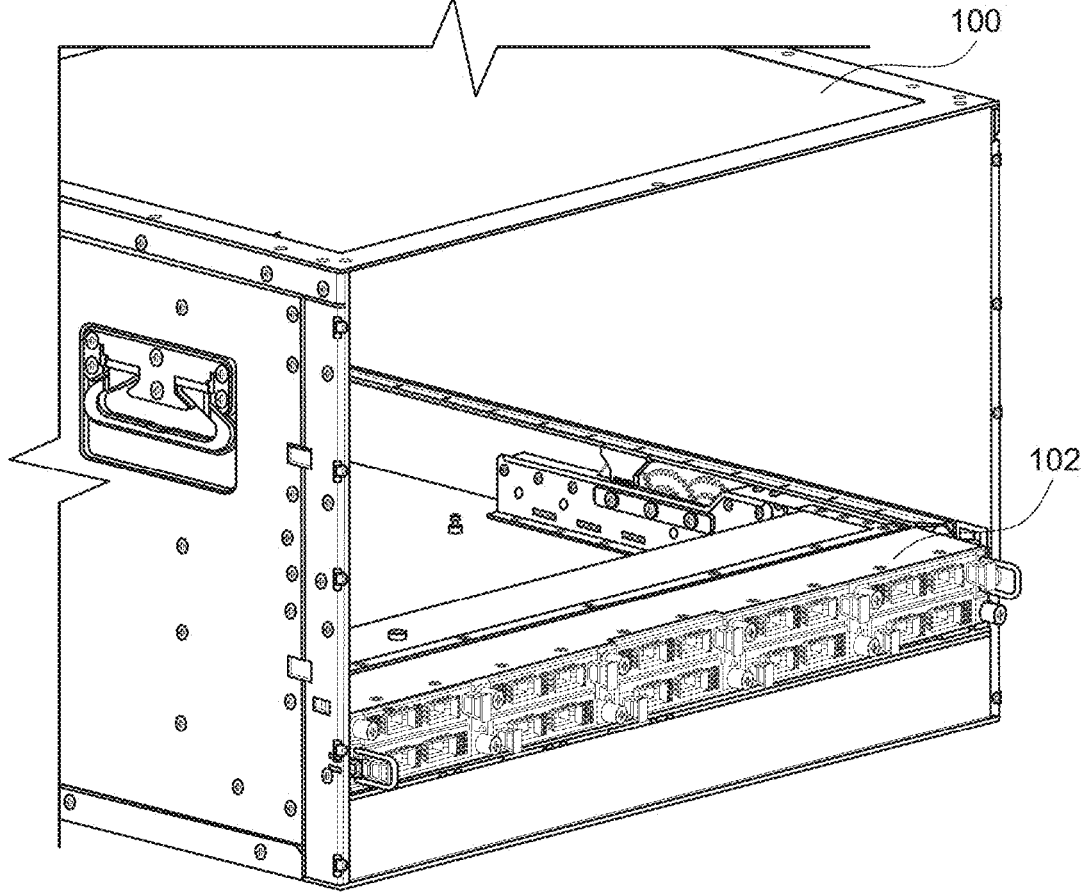
FIG. 15A is a perspective view of a sled in a lead-out process, according to certain aspects of the present disclosure.
Figure 15B:
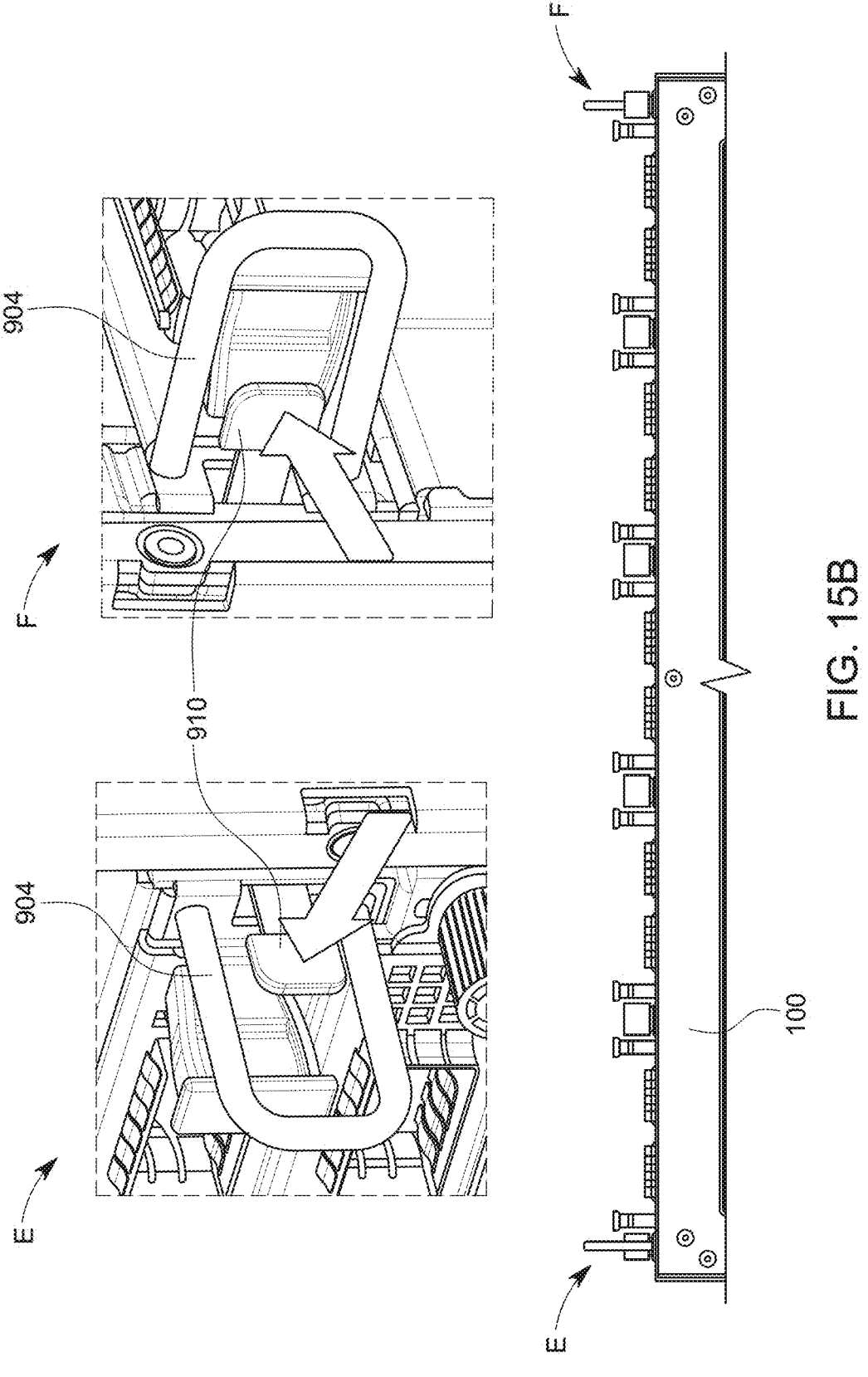
FIG. 15B is a top view of the sled shown in FIG. 15A along with magnified perspective views of E and F shown in the top view, according to certain aspects of the present disclosure.
Figure 15C:
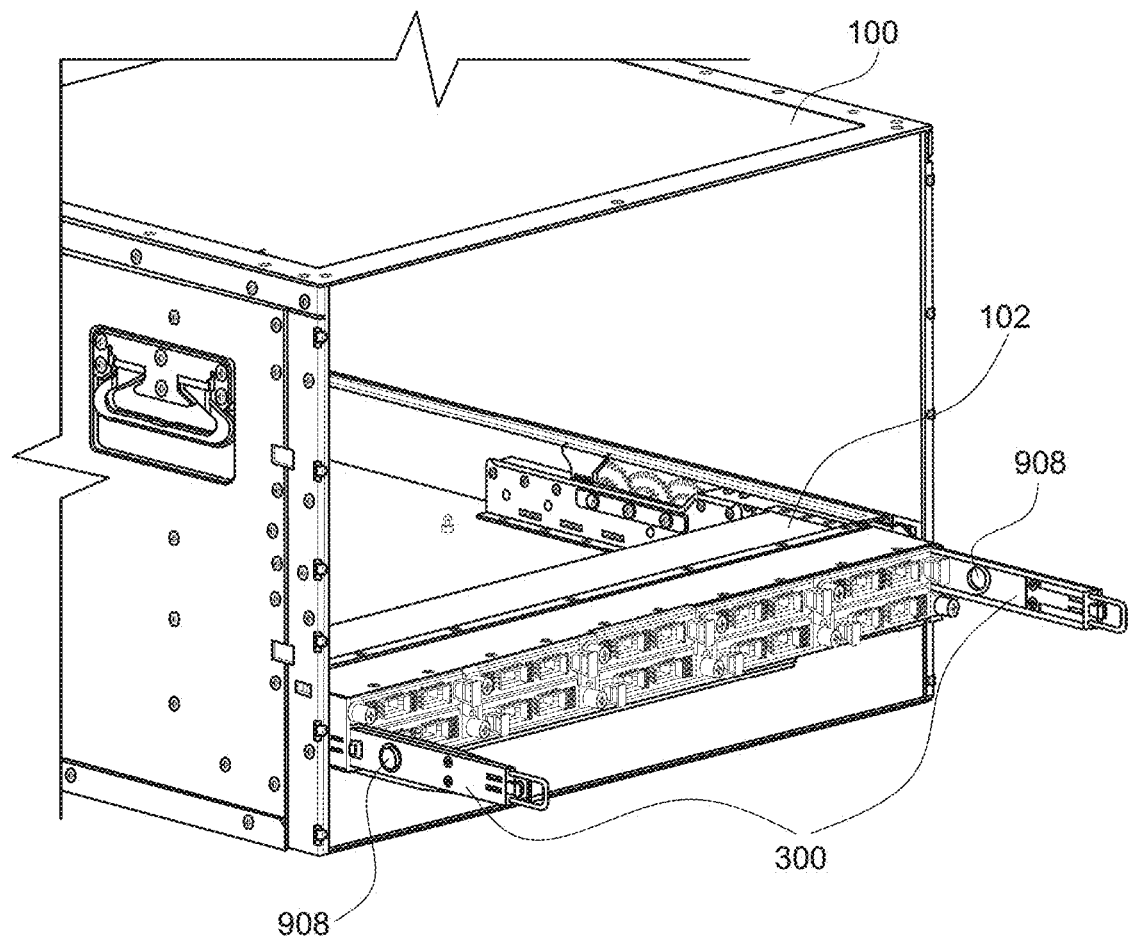
FIG. 15C is a perspective view of a sled further in the lead-out process, according to certain aspects of the present disclosure.
Figure 15D:
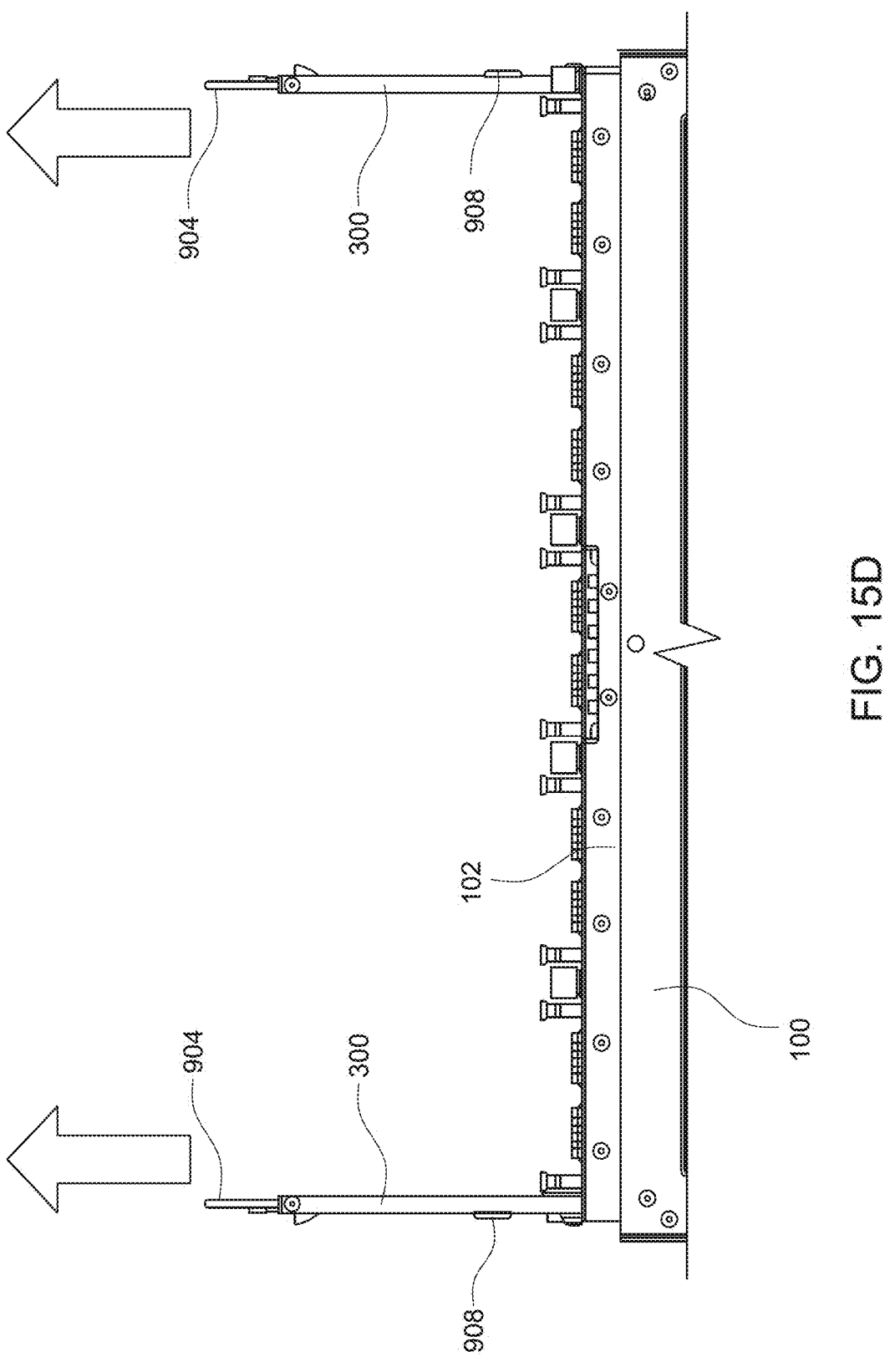
FIG. 15D is a top view of the sled shown in FIG. 15C, according to certain aspects of the present disclosure.
Figure 15E:
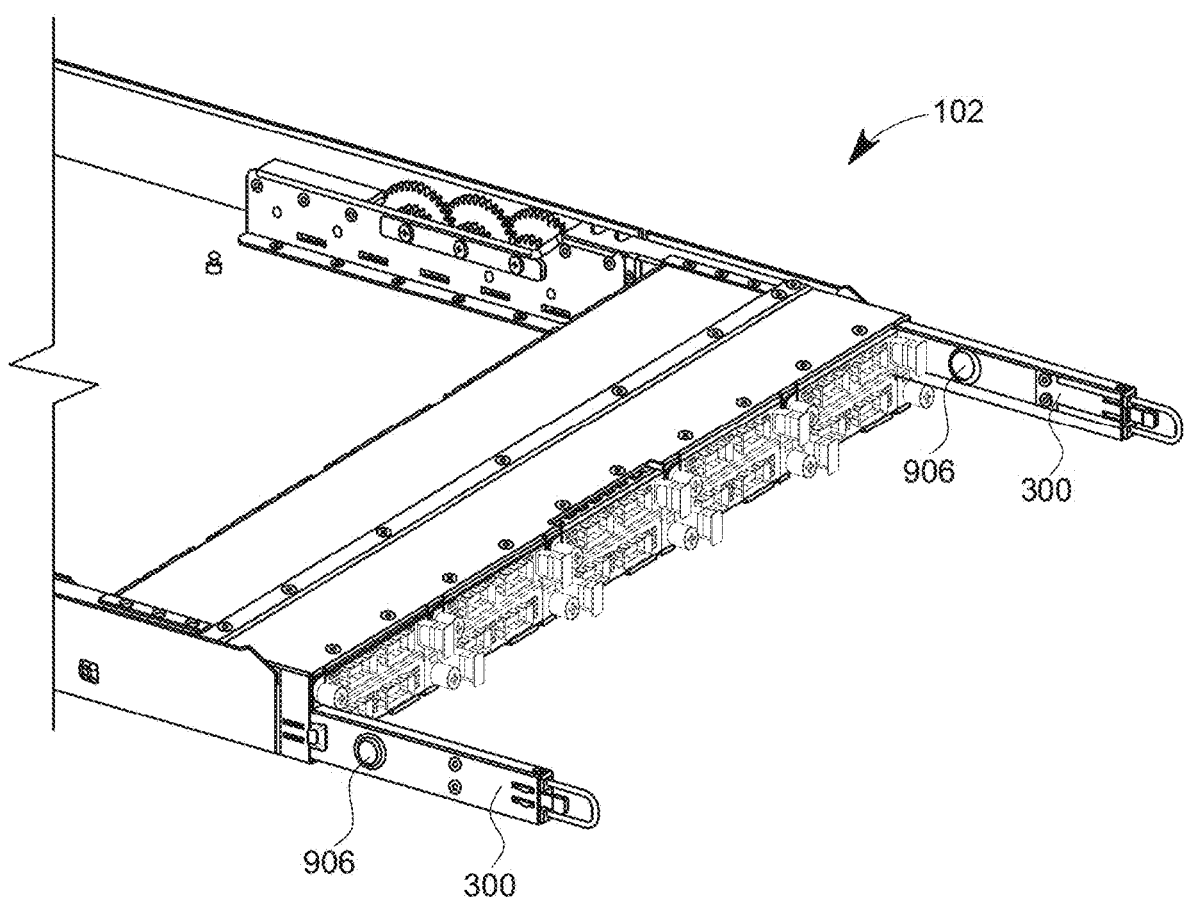
FIG. 15E is a perspective view of a sled further in the lead-out process, according to certain aspects of the present disclosure.
Figure 15F:
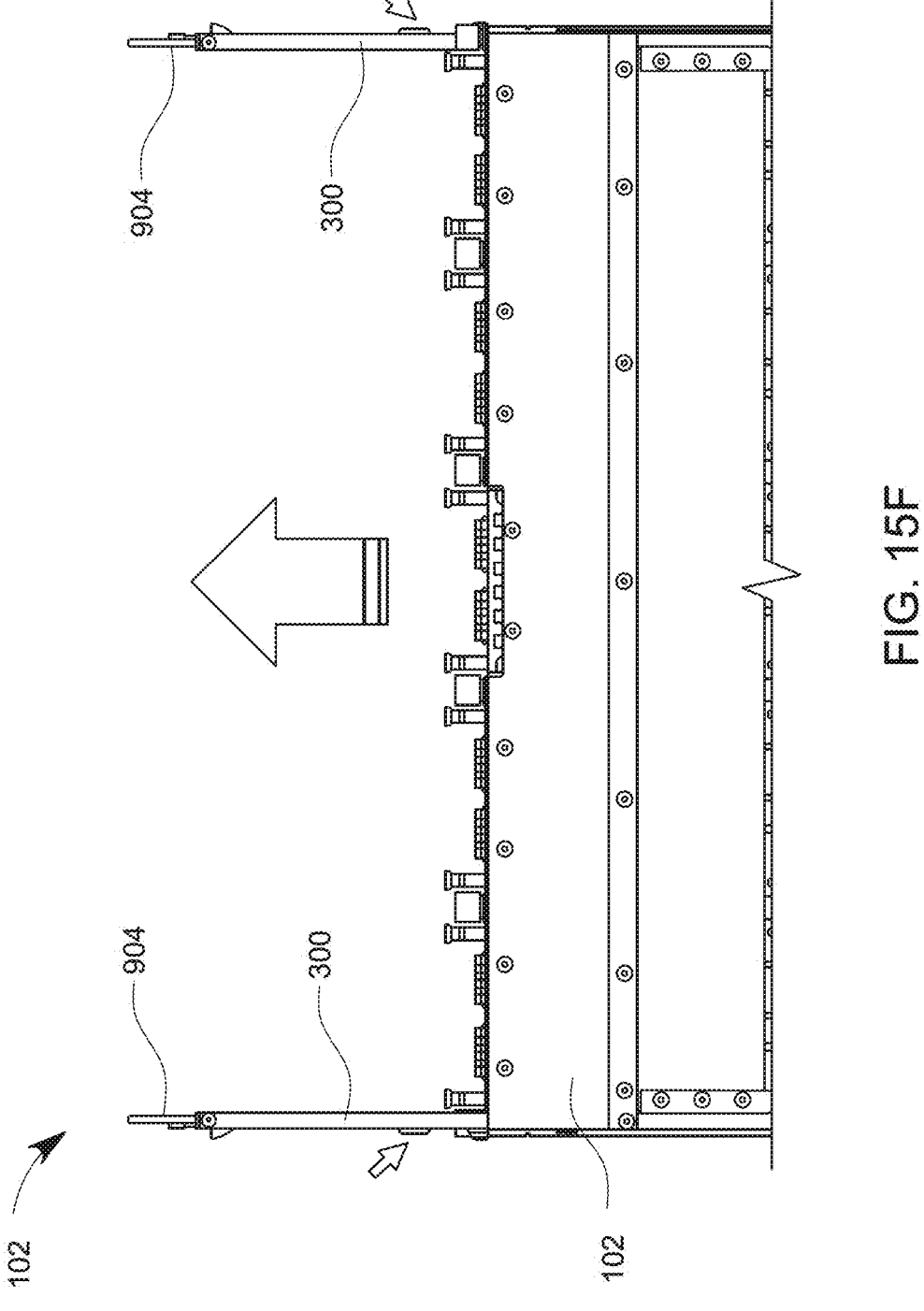
FIG. 15F is a top view of the sled shown in FIG. 15E, according to certain aspects of the present disclosure.
Figure 15G:
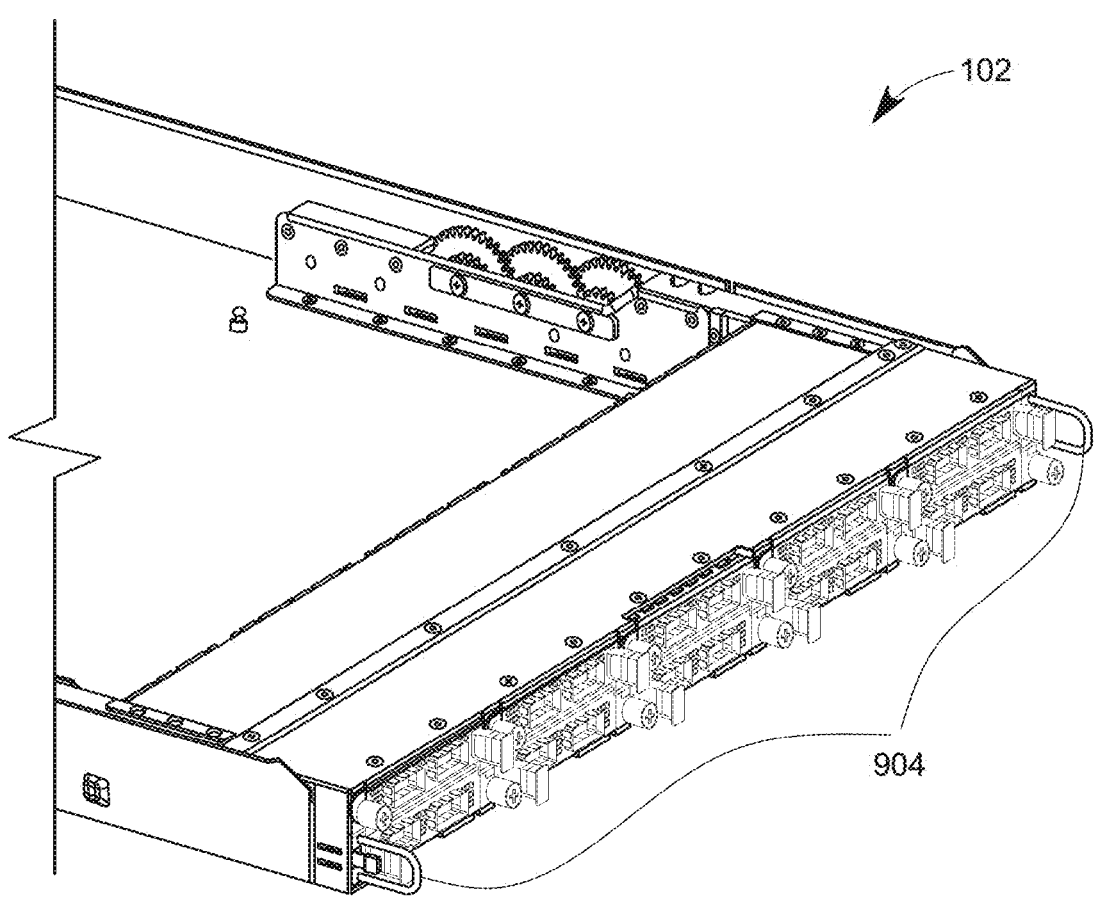
FIG. 15G is a perspective view of a sled further in the lead-out process, according to certain aspects of the present disclosure.
Figure 15H:
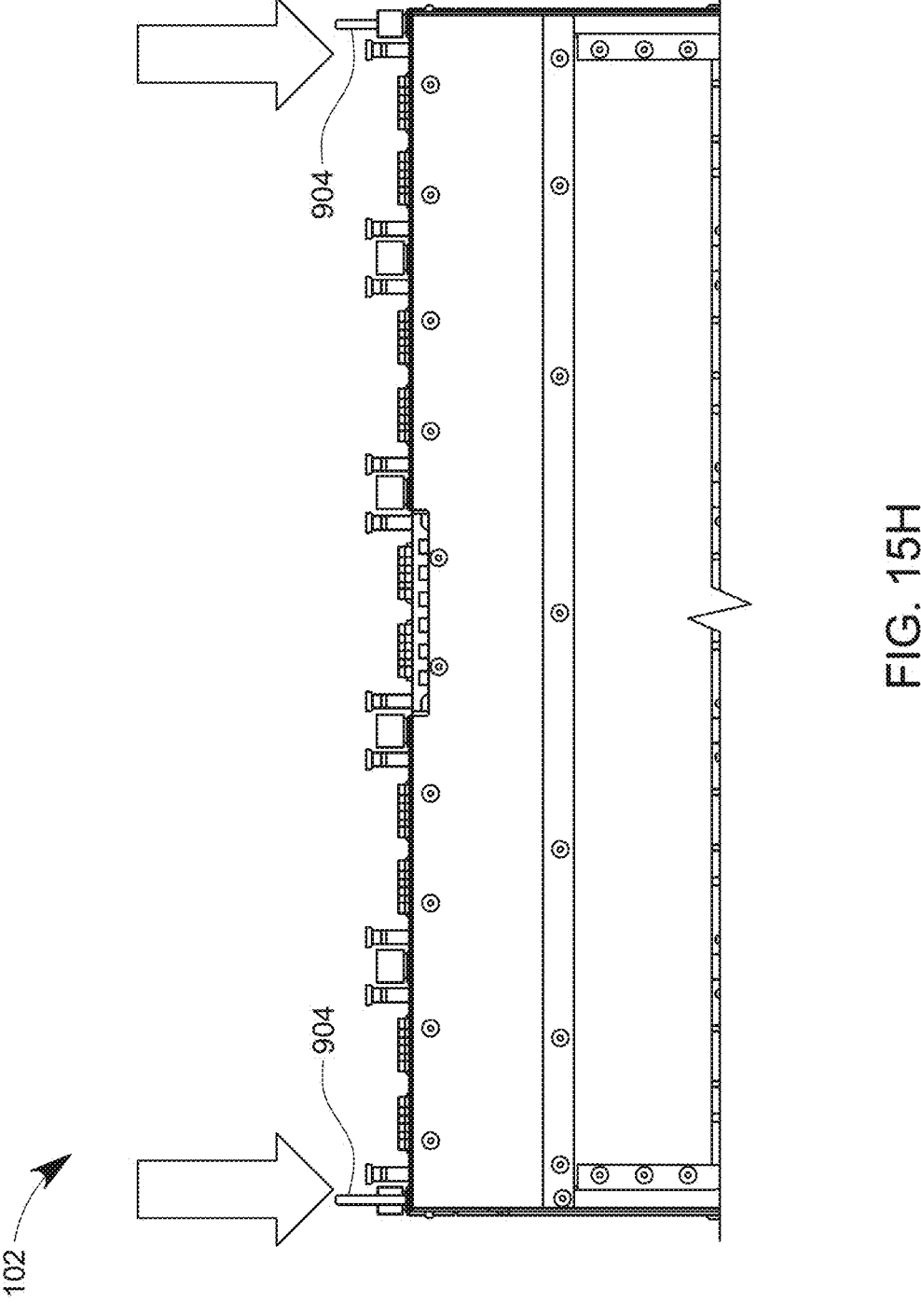
FIG. 15H is a top view of the sled shown in FIG. 15G, according to certain aspects of the present disclosure.

The lead-out process, according to certain aspects of the present disclosure, is described further, referring to FIGS. 15A-15H. When the sled 102 is in the lead-in lock position, the handle 904 is fixed by the first latch lock 912 (FIG. 15A). Also see FIGS. 9B and 9D. In order to pull out the sled 102 from the chassis 100, first, the first latch buttons 910 is pressed (indicated by arrows) to release the handles 904 (FIG. 15B). Once the handles 904 are unlocked and the handle mechanism 300 is released, the handle 904 is pulled outward. Then, the gear mechanism of the push-pull mechanism 106 will continuously push out the sled 102 (FIGS. 15C and 15D). When the handle 904 is pulled out and the movement of the bracket 604 is blocked by the stopper 1000, the second latch lock 908 pop ups (FIGS. 15C and 15D). Also see FIGS. 10B and 10C. Thereafter, the sled 102 can be pulled out directly (FIGS. 15E and 15F). After the sled 102 is pulled out fully, the second latch button 906 is pressed (indicated by arrows in FIG. 15F) to push the handle 904 back into the sled 102 (FIGS. 15G and 15H). Once the sled 102 is in the lead-out lock position, as shown in FIGS. 15G and 15H, the handle 904 is fixed by the first latch lock 912.

Figure 16A:
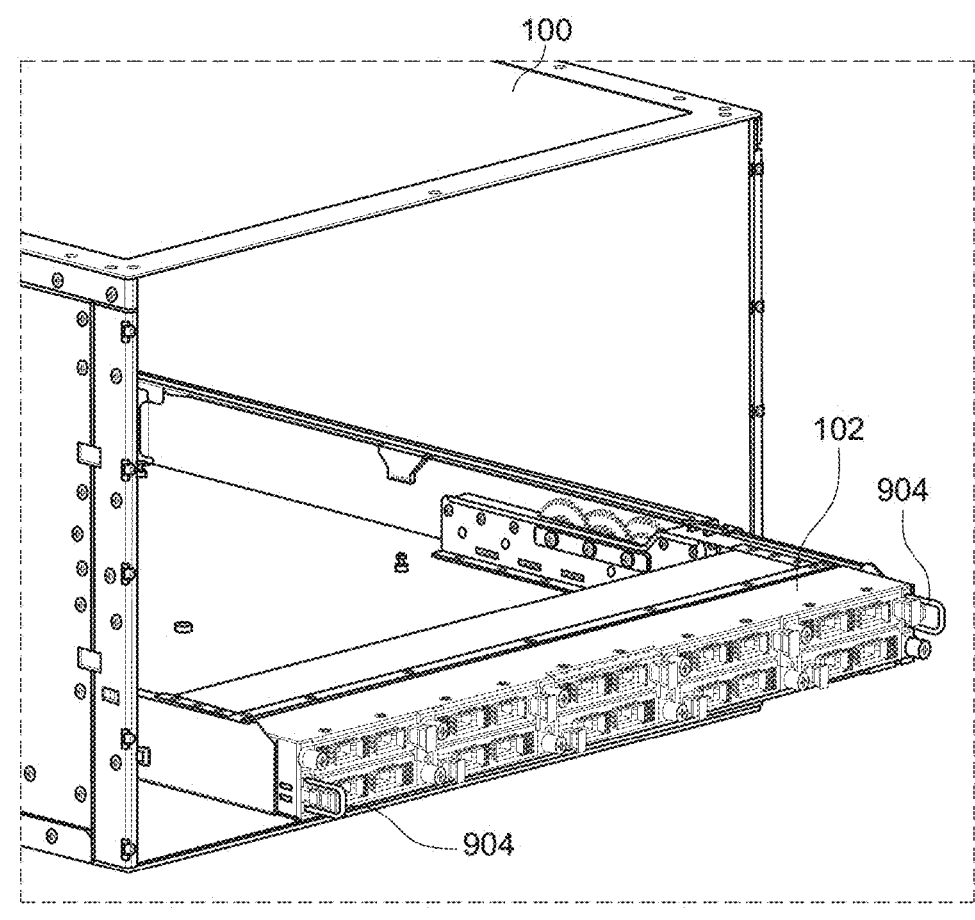
FIG. 16A is a perspective view of a sled in a lead-in process, according to certain aspects of the present disclosure.
Figure 16B:
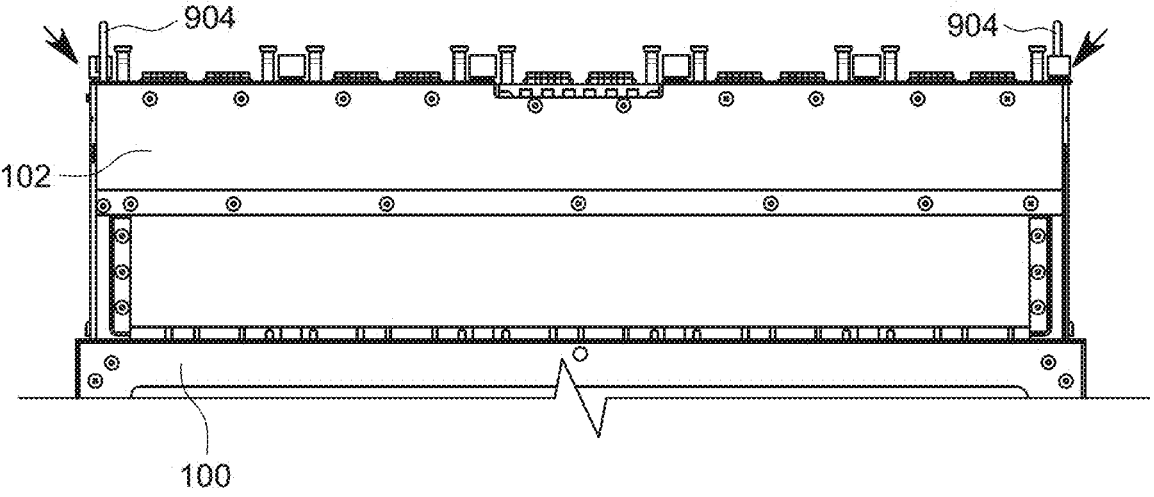
FIG. 16B is a top view of the sled shown in FIG. 16A, according to certain aspects of the present disclosure.
Figure 16C:
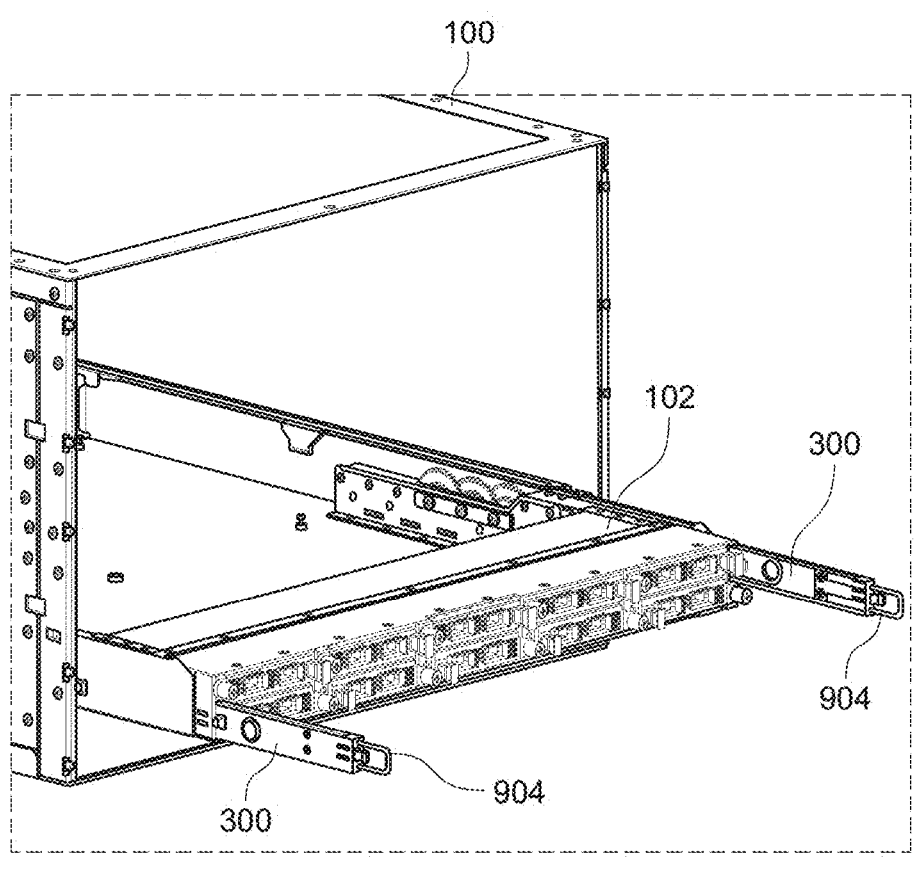
FIG. 16C is a perspective view of a sled further in the lead-in process, according to certain aspects of the present disclosure.
Figure 16D:
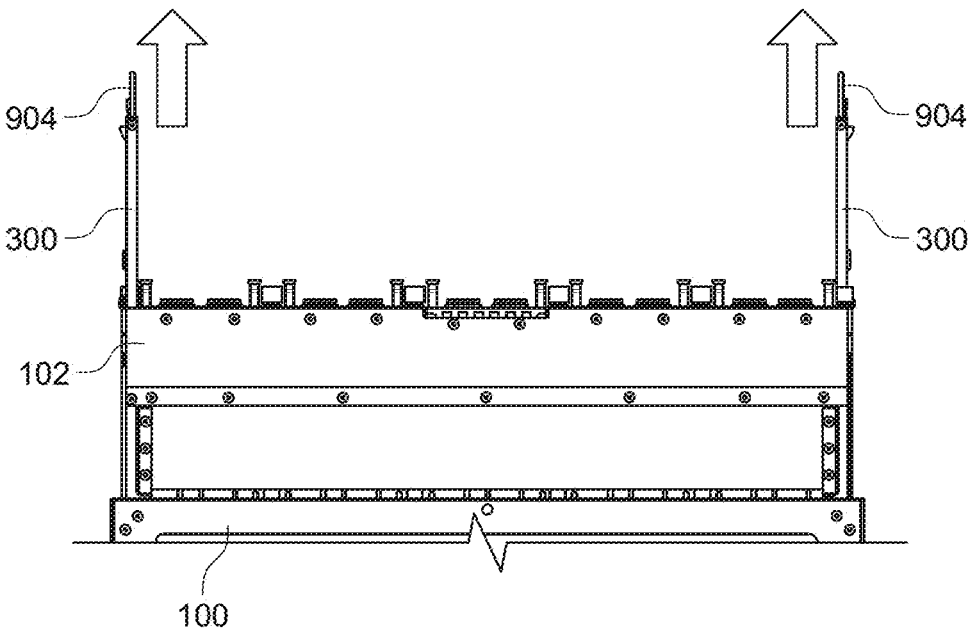
FIG. 16D is a top view of the sled shown in FIG. 16C, according to certain aspects of the present disclosure.
Figure 16E:
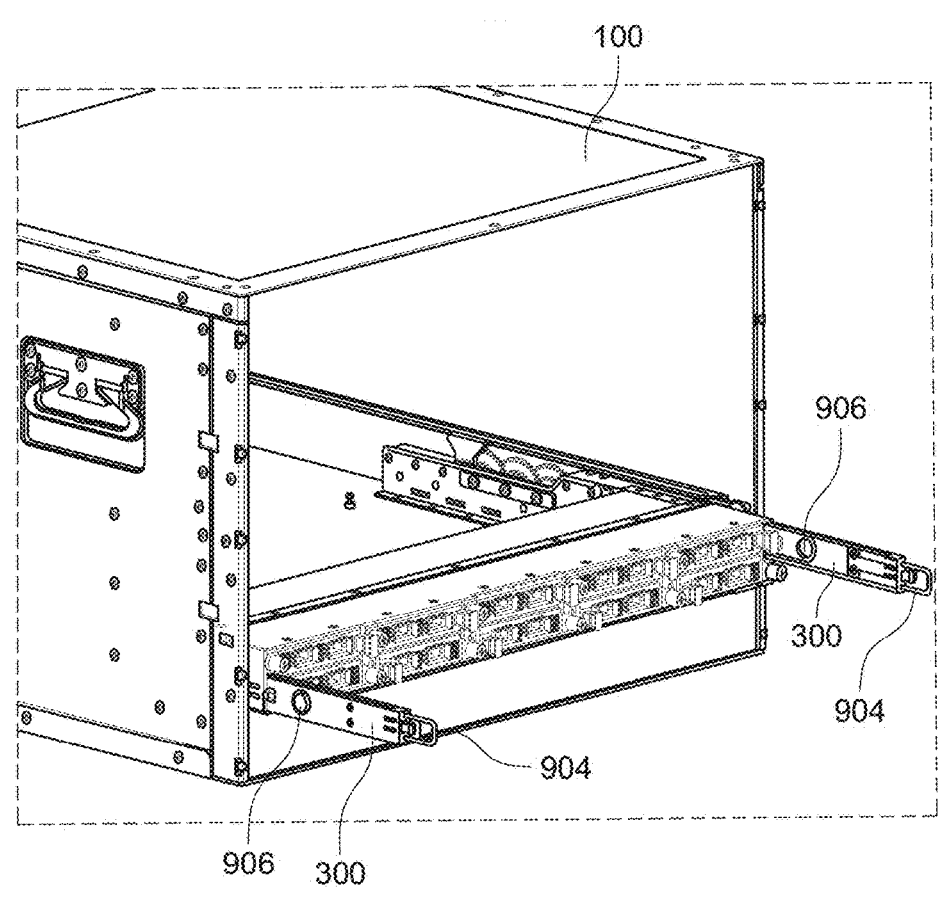
FIG. 16E is a perspective view of a sled further in the lead-in process, according to certain aspects of the present disclosure.
Figure 16F:
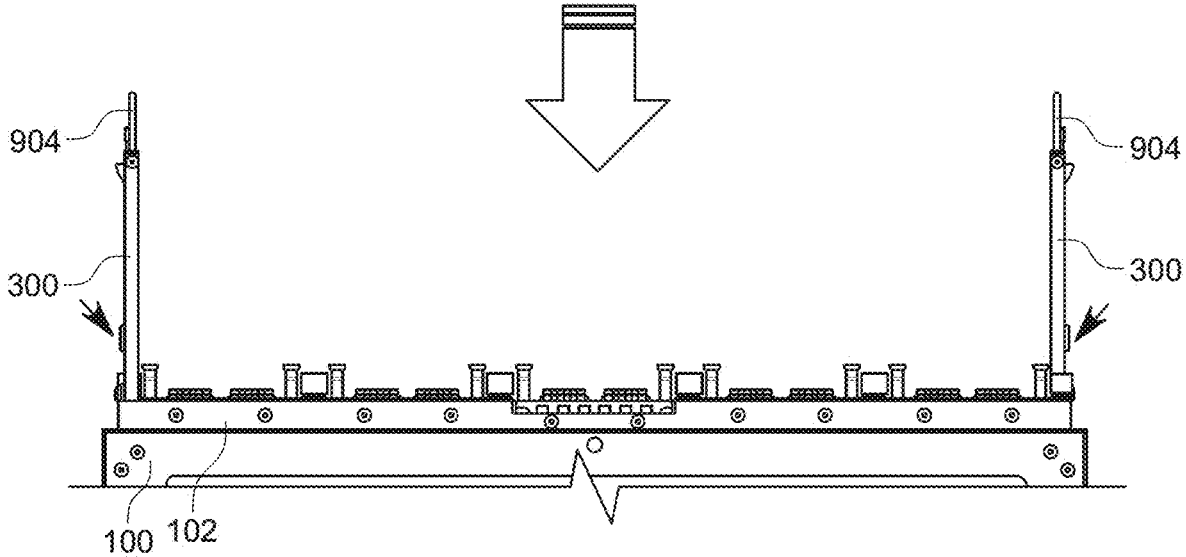
FIG. 16F is a top view of the sled shown in FIG. 16E, according to certain aspects of the present disclosure.
Figure 16G:
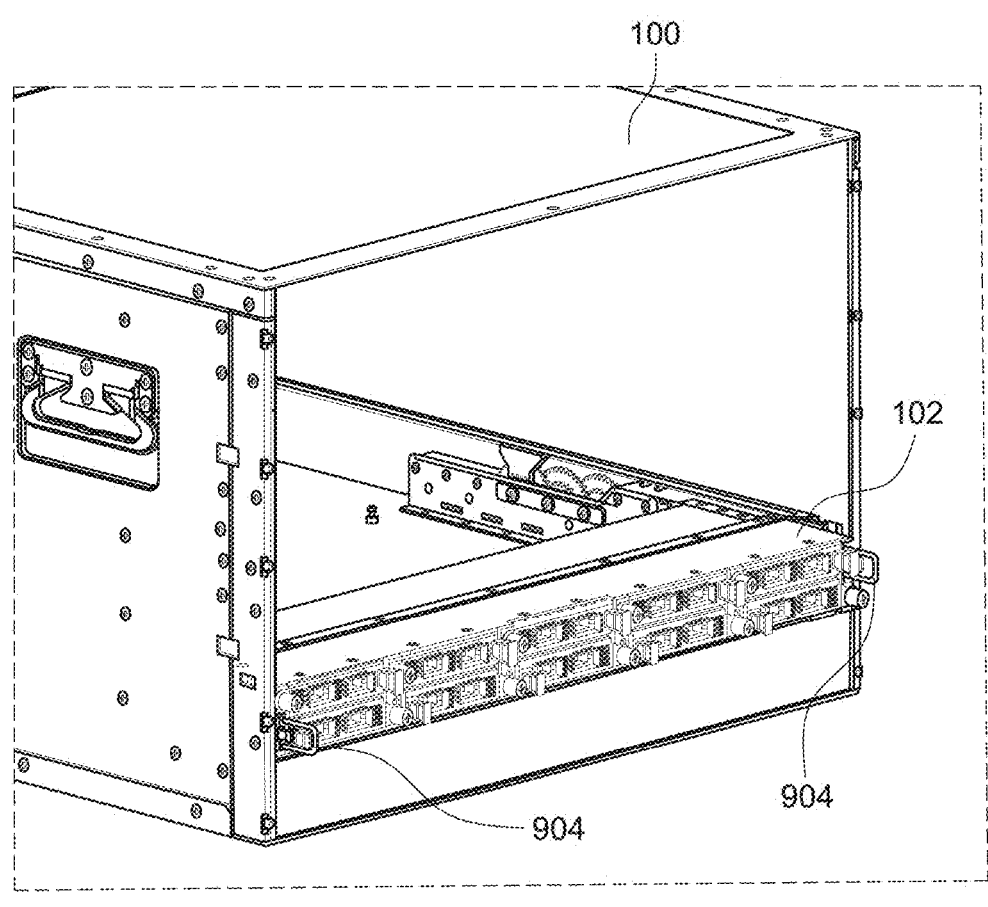
FIG. 16G is a perspective view of a sled further in the lead-in process, according to certain aspects of the present disclosure.
Figure 16H:
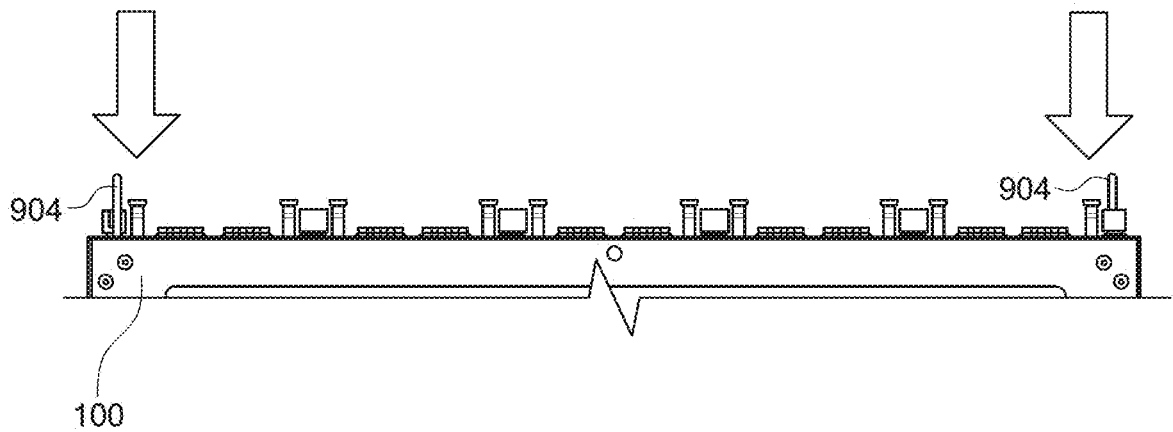
FIG. 16H is a top view of the sled shown in FIG. 16G, according to certain aspects of the present disclosure.

The lead-in process, according to certain aspects of the present disclosure, is described further, referring to FIGS. 16A-16H. In the lead-out lock position, the handle 904 is locked (FIGS. 16A and 16B). Thus, prior to pushing the sled 102 into the chassis 100, the handle 904 should be pulled out to the lead-out lock position first. If the handle 904 is in the folded state, the first latch button 910 is pressed (indicated by arrows in FIG. 16B) to release the handle 904. Then, the handle 904 is pulled outward (FIGS. 16C and 16D). Thereafter, the handle 904 is pushed until the second latch lock 908 contacts the rear wall of chassis 100 (FIG. 16E). Then the second latch button 906 is pressed (indicated by arrows in FIG. 16F) and the handle 904 is pushed inward to push the sled 102 into the chassis 100 (FIGS. 16G and 16H). When the handle 904 is pushed to the lead-in lock position, the first latch 900 is fixed to the sled 102 and the chassis 100.

Figure 17A:
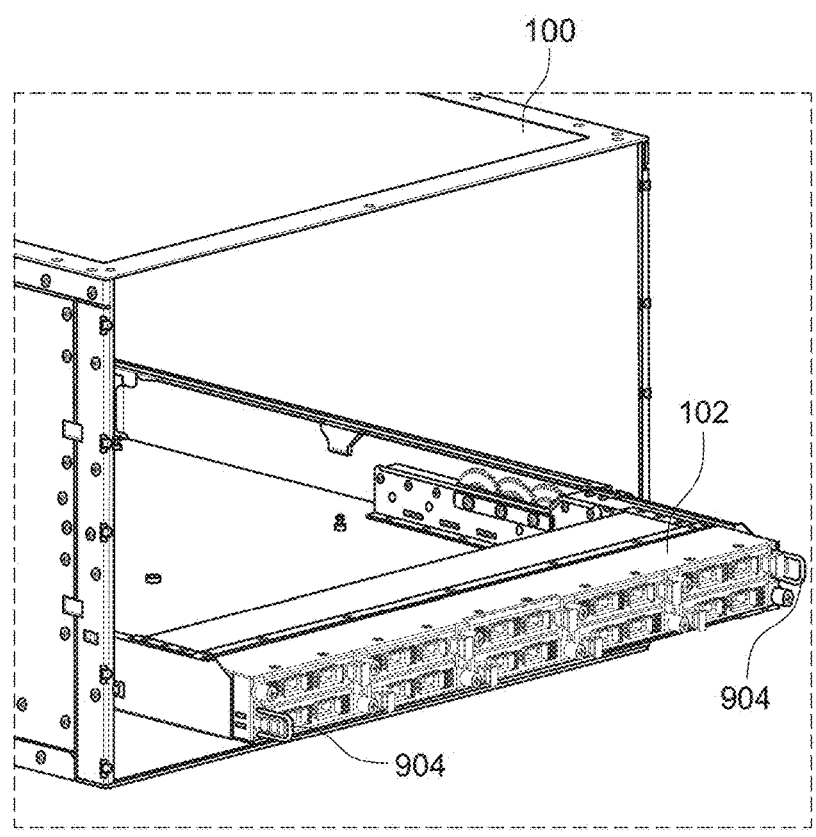
FIG. 17A is a perspective view of a sled with a handle in a folded state, according to certain aspects of the present disclosure.
Figure 17B:
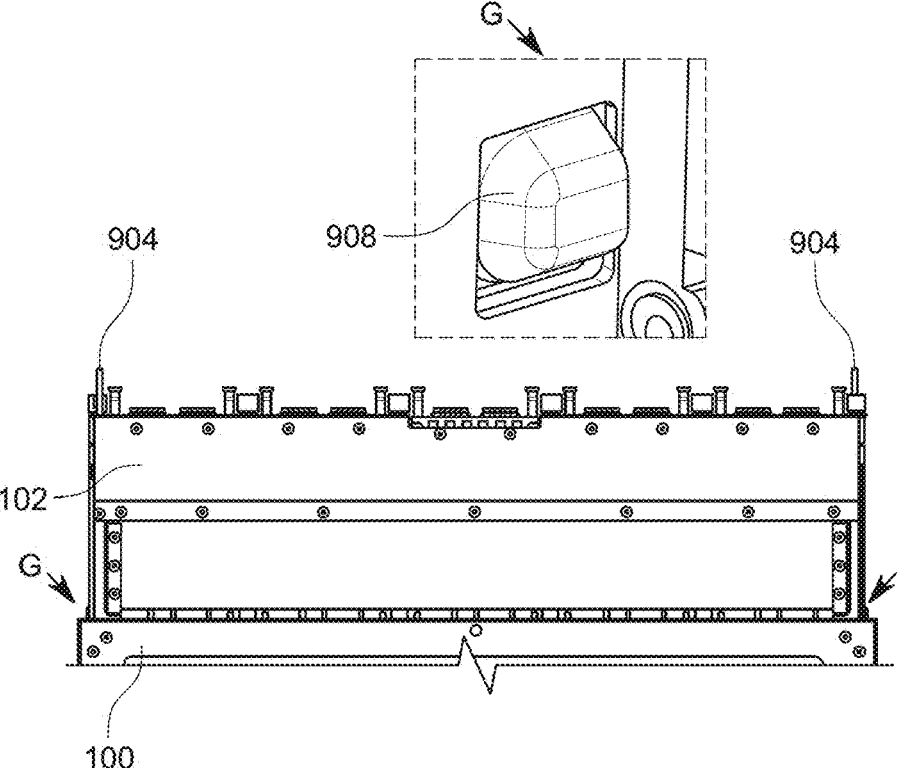
FIG. 17B is a top view of the sled shown in FIG. 17A along with a magnified view of G shown in the top view, according to certain aspects of the present disclosure.

Referring to FIGS. 17A and 17B, the sled 102 has a lead-in fool-proof mechanism, according to certain aspects of the present disclosure. If a user pushes the sled 102 inward while the handle 904 is in the folded state, the second latch lock 908 (indicated by arrows in FIG. 17B, a magnified view of area G indicated by the arrow is also shown in FIG. 17B) will be blocked from the chassis 100 to prevent the sled 102 from being pushed directly.

In terms of saving-effort, the output force will be amplified by the gear ratio, reducing the input force required. For example, the gear ratio of the gear mechanism is 8. Therefore, the input force required is ⅛ of the output demand. The total pushing force of the sled 102 requires 76.4 kgf which is determined by the connector's mating force. Based on the pushing requirement of the unilateral push-pull mechanism (38.2 kgf), the input force is calculated to be approximately 4.8 kgf. The total pulling force required is 17 kgf which is determined by connector's unmating force. Based on the pullout requirement of the unilateral push-pull mechanism (8.5 kgf), the input force is calculated to be approximately 1.1 kgf. The following table shows that this mechanism has met the saving-effort requirement under 5 kgf.
Lead-In/Lead-Out Analysis:

| Item | Lead-in | Lead-out |
|---|---|---|
| Output force request | 76.4 kgf | 17.0 kgf |
| Output force request (single side) | 38.2 kgf | 8.5 kgf |
| Input force (single side) | 4.8 kgf | 1.1 kgf |

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A sled for a server device, the sled comprising:
a sled housing having a first side wall that is parallel to a second side wall, a space being formed between the first side wall and the second side wall; and
a push-pull mechanism including a first mechanism coupled to the first side wall and a second mechanism coupled to the second side wall, the push-pull mechanism being configured to facilitate pushing the sled into and pulling the sled from a chassis of the server device, the pushing resulting in a lead-in lock position and the pulling resulting in a lead-out lock position,
wherein each of the first and second mechanisms includes:
a compound gear train with at least three compound gears that are rotatable to result in a respective one of the lead-in lock position and the lead-out lock position;
a short rack configured to mesh with one of the at least three compound gears, the short rack guiding movement of the sled between the lead-in lock position and the lead-out lock position; and a long rack configured to mesh with a different one of the at least three compound gears, the long rack guiding movement of the sled between the lead-in lock position and the lead-out lock position;
  wherein the short rack is fixed to a rail that is coupled to the chassis, the short rack being fixed in both the lead-in lock position and the lead-out lock position.

2. The sled of claim 1, wherein each of the first and second mechanisms further includes at least three shafts, the at least three shafts passing through bores of respective ones of the at least three compound gears, the at least three shafts being coupled to one of the first or second side walls.

3. The sled of claim 2, wherein each of the first and second mechanisms further includes a cover bracket configured to cover in part the at least three compound gears, the at least three shafts passing through respective through-holes formed on the cover bracket.

4. The sled of claim 3, wherein the at least three shafts include screws configured to lock the at least three compound gears to the first side wall or the second side wall, the at least three compound gears being mounted on a respective one of the at least three shafts, the at least three compound gears rotating in response to the pushing or pulling of the sled.

5. The sled of claim 1, wherein the at least three compound gears include:
  a first compound gear having a first large gear and a first small gear;
  a second compound gear having a second large gear and a second small gear; and
  a third compound gear having a third large gear and a third small gear,
  wherein the first, second, and third compound gears are the same size.

6. The sled of claim 5, wherein the first small gear is configured to mesh with the short rack and the third large gear is configured to mesh with the long rack.

7. The sled of claim 6, wherein:
  the first large gear meshes with the second small gear;
  the second large gear meshes with the third small gear; and
  the first, second, and third compound gears are spaced apart without interfering with each other.

8. The sled of claim 5, wherein:
  each of the first, second, and third large gears has a number of large gear teeth that is twice a number of small gear teeth of each of the first, second, and third small gears;
  when the at least three compound gears rotate, a speed of the second compound gear being half of a speed of the third compound gear and a speed of the first compound gear being a quarter of the speed of the third compound gear; and
  when the third compound gear rotates counterclockwise, the second compound gear rotates clockwise and the first compound gear rotates counterclockwise.

9. The sled of claim 1, wherein each of the first and second mechanisms further includes a bracket on which the long rack is fixed, the bracket being configured to slide under the at least three compound gears.

10. The sled of claim 9, wherein the bracket is coupled to a handle mechanism via a fastener, the handle mechanism including a handle.

11. The sled of claim 10, wherein the fastener comprises a captive screw attached to the handle mechanism and fastened to a receiving hole formed on the bracket.

12. The sled of claim 10, wherein:
  the handle mechanism further includes a first latch configured to fix the sled and the chassis in the lead-in lock position; and
  the handle is configured to unlock, being released from the sled housing and the chassis, in response to pressing a first latch button in the lead-in lock position such that the handle is pullable out of the sled housing and chassis into the lead-out lock position.

13. The sled of claim 12, further comprising a stopper located on a floor of the sled, the stopper being configured to contact the bracket, preventing the handle from being pulled further when the short rack and the first small gear disengage, in response to pulling the handle.

14. The sled of claim 13, wherein the handle mechanism further includes a second latch configured to pop up when the bracket contacts the stopper, in response to the pulling the handle out, the popped-up second latch preventing the pulled handle from being pushed into the sled housing.

15. The sled of claim 14, wherein the handle is allowed to be pushed back into the sled housing and the first latch is configured to fix the handle in response to pressing a second latch button after the sled is pulled out of the chassis.

16. The sled of claim 14, wherein both the first latch and the second latch are popped up in response to pushing the handle into the lead-in lock position, the first latch preventing the handle from being pulled out of the sled housing and chassis, and the second latch preventing the handle that is in the lead-in lock position from being pushed in further.

17. The sled of claim 14, wherein:
  when the handle is pushed inward, such that the sled is pushed into the chassis, the second latch contacts a rear wall of the chassis such that the sled is no longer pushable inward unless a second latch button is pressed; and
  the sled is pushable into the chassis in response to pushing the handle inward, following pressing of the second latch button.

18. The sled of claim 17, wherein the first small gear contacts the short rack when the sled is pushed into the chassis.

19. A server device comprising:
  a chassis; and
  a sled configured to be pushed to and pulled from the chassis,
  the sled comprising:
    a sled housing having a first side wall that is parallel to a second side wall, a space being formed between the first side wall and the second side wall; and
    a push-pull mechanism including a first mechanism coupled to the first side wall and a second mechanism coupled to the second side wall, the push-pull mechanism being configured to facilitate pushing the sled into and pulling the sled from the chassis, the pushing resulting in a lead-in lock position and the pulling resulting in a lead-out lock position,
  wherein each of the first and second mechanisms includes:
    a compound gear train with at least three compound gears that are rotatable to result in a respective one of the lead-in lock position and the lead-out lock position;
    a short rack configured to mesh with one of the at least three compound gears, the short rack guiding movement of the sled between the lead-in lock position and the lead-out lock position; and
    a long rack configured to mesh with a different one of the at least three compound gears, the long rack guiding movement of the sled between the lead-in lock position and the lead-out lock position;

wherein the short rack is fixed to a rail that is coupled to the chassis, the short rack being fixed in both the lead-in lock position and the lead-out lock position.

20. A sled for a server device, the sled comprising:

a sled housing having a first side wall that is parallel to a second side wall, a space being formed between the first side wall and the second side wall; and a push-pull mechanism including a first mechanism coupled to the first side wall and a second mechanism coupled to the second side wall, the push-pull mechanism being configured to facilitate pushing the sled into and pulling the sled from a chassis of the server device, the pushing resulting in a lead-in lock position and the pulling resulting in a lead-out lock position, wherein each of the first and second mechanisms includes:

a compound gear train with at least three compound gears that are rotatable to result in a respective one of the lead-in lock position and the lead-out lock position;

a short rack configured to mesh with one of the at least three compound gears, the short rack guiding movement of the sled between the lead-in lock position and the lead-out lock position; and a long rack configured to mesh with a different one of the at least three compound gears, the long rack guiding movement of the sled between the lead-in lock position and the lead-out lock position;

wherein the at least three compound gears include:

a first compound gear having a first large gear and a first small gear;

a second compound gear having a second large gear and a second small gear; and a third compound gear having a third large gear and a third small gear, wherein the first, second, and third compound gears are the same size;

wherein the first small gear is configured to mesh with the short rack and the third large gear is configured to mesh with the long rack; and wherein:

the first large gear meshes with the second small gear, the second large gear meshes with the third small gear, and the first, second, and third compound gears are spaced apart without interfering with each other.

21. A sled for a server device, the sled comprising:

a sled housing having a first side wall that is parallel to a second side wall, a space being formed between the first side wall and the second side wall; and a push-pull mechanism including a first mechanism coupled to the first side wall and a second mechanism coupled to the second side wall, the push-pull mechanism being configured to facilitate pushing the sled into and pulling the sled from a chassis of the server device, the pushing resulting in a lead-in lock position and the pulling resulting in a lead-out lock position, wherein each of the first and second mechanisms includes:

a compound gear train with at least three compound gears that are rotatable to result in a respective one of the lead-in lock position and the lead-out lock position;

a short rack configured to mesh with one of the at least three compound gears, the short rack guiding movement of the sled between the lead-in lock position and the lead-out lock position; and a long rack configured to mesh with a different one of the at least three compound gears, the long rack guiding movement of the sled between the lead-in lock position and the lead-out lock position;

wherein the at least three compound gears include:

a first compound gear having a first large gear and a first small gear;

a second compound gear having a second large gear and a second small gear; and a third compound gear having a third large gear and a third small gear, wherein the first, second, and third compound gears are the same size;

wherein the first small gear is configured to mesh with the short rack and the third large gear is configured to mesh with the long rack; and wherein:

each of the first, second, and third large gears has a number of large gear teeth that is twice a number of small gear teeth of each of the first, second, and third small gears, when the at least three compound gears rotate, a speed of the second compound gear being half of a speed of the third compound gear and a speed of the first compound gear being a quarter of the speed of the third compound gear, and when the third compound gear rotates counterclockwise, the second compound gear rotates clockwise and the first compound gear rotates counterclockwise.

22. A sled for a server device, the sled comprising:

a sled housing having a first side wall that is parallel to a second side wall, a space being formed between the first side wall and the second side wall; and a push-pull mechanism including a first mechanism coupled to the first side wall and a second mechanism coupled to the second side wall, the push-pull mechanism being configured to facilitate pushing the sled into and pulling the sled from a chassis of the server device, the pushing resulting in a lead-in lock position and the pulling resulting in a lead-out lock position, wherein each of the first and second mechanisms includes:

a compound gear train with at least three compound gears that are rotatable to result in a respective one of the lead-in lock position and the lead-out lock position;

a short rack configured to mesh with one of the at least three compound gears, the short rack guiding movement of the sled between the lead-in lock position and the lead-out lock position; and a long rack configured to mesh with a different one of the at least three compound gears, the long rack guiding movement of the sled between the lead-in lock position and the lead-out lock position;

wherein each of the first and second mechanisms further includes a bracket on which the long rack is fixed, the bracket being configured to slide under the at least three compound gears;

wherein the bracket is coupled to a handle mechanism via a fastener, the handle mechanism including a handle;

wherein:

the handle mechanism further includes a first latch configured to fix the sled and the chassis in the lead-in lock position, and the handle is configured to unlock, being released from
the sled housing and the chassis, in response to
pressing a first latch button in the lead-in lock
position such that the handle is pullable out of the
sled housing and chassis into the lead-out lock 5
position; and further comprising a stopper located on a floor of the sled,
the stopper being configured to contact the bracket,
preventing the handle from being pulled further when
the short rack and the first small gear disengage, in 10
response to pulling the handle.

\* \* \* \* \*